United States Patent [19]
Li et al.

[11] Patent Number: 6,069,116
[45] Date of Patent: May 30, 2000

[54] METHOD OF FORMING BSCCO SUPERCONDUCTING COMPOSITE ARTICLES

[75] Inventors: Qi Li; Gilbert N. Riley, Jr., both of Marlborough; Lawrence J. Masur, Needham; Eric R. Podtburg, Natick; Ronald D. Parrella, Shrewsbury; Martin W. Rupich, Framingham; Donald R. Parker, Randolph; William L. Carter, Chelmsford; William J. Rosati, Milford; Mark D. Teplitsky, Westborough, all of Mass.

[73] Assignee: American Superconductor Corp., Westborough, Mass.

[21] Appl. No.: 08/927,006

[22] Filed: Sep. 10, 1997

[51] Int. Cl.$^7$ ...................................................... H01L 39/24
[52] U.S. Cl. .......................... 505/431; 505/432; 505/433; 505/430; 29/599
[58] Field of Search ...................................... 505/431, 432, 505/433, 430, 230, 231; 29/599; 174/125.1

[56] References Cited

U.S. PATENT DOCUMENTS

| | | | |
|---|---|---|---|
| 5,330,969 | 7/1994 | Finnemore et al. | 505/431 |
| 5,347,085 | 9/1994 | Kikuchi et al. | 505/231 |
| 5,798,318 | 8/1998 | Li et al. | 505/501 |
| 5,885,938 | 3/1999 | Otto et al. | 505/431 |

*Primary Examiner*—Roy V. King
*Attorney, Agent, or Firm*—Clark & Elbing LLP; Mary Rose Scozzafava

[57] ABSTRACT

A novel process of the production and processing of high quality, high $T_c$ BSCCO or (Bi,Pb)SCCO superconductors starts with fabrication of a forming a bundle including a plurality of billets, each billet containing at least one filament comprising a dominant amount of an tetragonal BSCCO phase with selected intermediate phases, and substantially surrounded by a constraining metal. The bundle is thermomechanically consolidated to form a multifilamentary precursor article by applying pressure and heat to the bundle under conditions cooperatively selected to cause interdiffusion of said constraining metal at the interfaces between said metal and said filaments and substantially complete elimination of voids in said bundle, and the consolidation step is completed before any high strain longitudinal deformation is performed on the bundle. The precursor article is then heated at a second selected processing temperature in an inert atmosphere with a second selected oxygen partial pressure for a second selected time period, the second processing temperature, the second time period and the second oxygen partial pressure being cooperatively selected to form a dominant amount of an orthorhombic BSCCO phase in the reacted mixture. It may then be deformed to form an elongated precursor article of a desired texture; and thereafter heated at a third selected processing temperature in an inert atmosphere with a third selected oxygen partial pressure for a third selected time period, all cooperatively selected to convert at least a portion of the orthorhombic BSCCO phase to the final superconducting BSCCO material.

31 Claims, 6 Drawing Sheets

METHOD OF FORMING BSCCO SUPERCONDUCTING COMPOSITE ARTICLES

BACKGROUND OF THE INVENTION

The present invention relates to the production and processing of high $T_c$ superconducting bismuth-strontium-calcium-copper-oxide materials.

Since the discovery of the copper oxide ceramic superconductors, their physical and chemical properties have been widely studied and described in many publications, too numerous to be listed individually. These materials have superconducting transition temperatures ($T_c$) greater than the boiling temperature (77° K) of liquid nitrogen. However, in order to be useful for the majority of applications, substantially single phase superconducting materials with high critical current densities ($J_c$) are needed. In general, this requires that the grains of the superconductor be crystallographically aligned, or textured, and well sintered together. Several members of the bismuthstrontium-calcium-copper-oxide family (BSCCO), in particular, $Bi_2Sr_2CaCu_2O_8$ (BSCCO 2212) and $Bi_2Sr_2Ca_2Cu_3O_{10}$ (BSCCO 2223) have yielded promising results, particularly when the bismuth is partially substituted by dopants, such as lead ((Bi,Pb)SCCO).

Composites of superconducting materials and metals are often used to obtain better mechanical properties than superconducting materials alone provide. These composites may be prepared in elongated forms such as wires and tapes by the well-known "powder-in-tube" or "PIT" process which includes, for multifilamentary articles, the three stages of: forming a powder of superconductor precursor material (precursor powder formation stage); filling a noble metal billet with the precursor powder, longitudinally deforming and annealing it, forming a bundle of billets or of previously formed bundles, and longitudinally deforming and annealing the bundle to provide a composite of reduced cross-section including one or more filaments of superconductor precursor material in a surrounding noble metal matrix (composite precursor fabrication stage); and subjecting the composite to successive asymmetric deformation and annealing cycles and further thermally processing the composite to form and sinter a core material having the desired superconducting properties (thermomechanical processing stage). General information about the PIT method described above and processing of the oxide superconductors is provided by Sandhage et al., in JOM, Vol. 43, No. 3 (1991) pages 21 through 25, and the references cited therein, by Tenbrink, Wilhelm, Heine and Krauth, Development of Technical High-Tc Superconductor Wires and Tapes, Paper MF-1, Applied Superconductivity Conference, Chicago (Aug. 23–28, 1992), and Motowidlo, Galinski, Hoehn, Jr. and by Haldar, Mechanical and Electrical Properties of BSCCO Multifilament Tape Conductors, paper presented at Materials research Society Meeting, Apr. 12–15, 1993.

In the composite precursor fabrication stage, longitudinal deformation operations, i.e., wire drawing and/or extrusion, which form the billet or bundle into an elongated shape such as a wire or tape are followed by low temperature anneals, typically on the order of 200 C. to 450 C. at 1 atm in air for silver, to relieve strain energy introduced by deformation, without causing substantial reaction of the precursor powder or melting or grain growth in the silver. FIG. 1 (prior art) is a typical annealing curve showing silver hardness as a function of annealing temperature. In some instances, a high temperature thermal anneal, typically on the order of 600 C. at 1 atm in air for silver, has been performed prior to the first bundle deformation step in the stage to bond the billets to one another. In other instances, where high strain deformations involving reductions of 100% or more have been performed, a high temperature thermal anneal, typically on the order of 600 C. at 1 atm in air for silver, has been included as the last step in the stage in order to relieve the strain energy in the matrix material prior to thermomechanical processing.

The deformation portions of the deformation and annealing cycles in the thermomechanical processing stage, are asymmetric deformations which create alignment of precursor grains in the core ("textured" grains) which facilitate the growth of well-aligned and sintered grains of the desired superconducting material during later thermal processing stages. Examples are rolling and the isostatic pressing cycle described in U.S. patent application Ser. No. 07/906,843 (U.S. '843) filed Jun. 30, 1992 entitled "High Tc Superconductor and Method for Making It", which is herein incorporated in its entirety by reference. They may be followed by anneals to relieve strain energy in the metal portions of the composite precursor. A series of heat treatments is also typically performed during the thermomechanical processing stage to promote powder reactions, including final thermomechanical treatment stages employed to more fully convert the filaments to the desired final, highly textured superconducting phase, preferably BSCCO or (Bi, Pb)SCCO 2223. The thermomechanical processing may be carried out by any conventional method, such as for example those described in Sandhage et al, supra, Tenbrink et al, supra, Haldar, supra, and in U.S. Pat. No. 5,635,456 issued Jun. 3, 1997, entitled "Improved Processing for Oxide Superconductors," and U.S. Pat. No. 5,661,114 issued Aug. 26, 1997, entitled "Improved Processing of Oxide Superconductors", and U.S. patent application Ser. No. 08/468,089, (U.S. '089) filed Jun. 6, 1995 entitled "Improved Deformation Process for Superconducting Ceramic Composite Conductors", and Ser. No. 08/651,169 (U.S. '169) filed May 21, 1996, entitled "A Novel reaction for High Performance (Bi, Pb)$_2$Sr$_2$Ca$_2$Cu$_3$O$_y$ Composites", all of which are hereby incorporated in their entirety by reference.

The general process is practiced in several variants depending on the starting powders, which may be, for example, metal alloys having the same metal content as the desired superconducting core material in the "metallic precursor" or "MPIT" process, or mixtures of powders of the oxide components of the desired superconducting oxide core material or of a powder having the nominal composition of the desired superconducting oxide core material in the "oxide powder" or "OPIT" process. OPIT precursor powders may be prepared by reacting raw powders such as the corresponding oxides, oxalates, carbonates, nitrides or nitrates of the metallic elements of the desired superconducting oxide. One or more subsequent chemical reactions, some of which typically occur inside the formed filaments, create the superconducting material in combination with greater or lesser amounts of non-superconducting secondary phases. Because the desired superconducting material is formed by a series of chemical reactions, its performance will depend on the quality and chemical composition of the starting materials and on the subsequent processing conditions, such as temperature, time, and atmosphere. Different processing conditions will give rise to different phases or different ratios of phases, some of which, being easier to mechanically texture or more likely to achieve complete reaction into the final superconducting material, are more desirable than others. Various intermediate reactions may be deliberately promoted in order to create more desirable intermediate phases or to increase the ratio of the final superconducting material to the secondary phases in the finished product.

For example, it has been observed that the orthorhombic phase of BSCCO 2212 responds better to the asymmetric deformation required for deformation-induced texturing resulting in a denser, less porous oxide grain structure, and so, undergoes texturing to a much greater extent than the corresponding tetragonal phase. Moreover, the orthorhombic phase of (Bi,Pb)SCCO 2212 represents doping of lead into the BSCCO solid state structure with the concomitant conversion of the lead-free tetragonal phase into the orthorhombic phase. The lead-doped orthorhombic phase readily converts to the final superconductor, (Bi,Pb)SCCO 2223 to give a high quality superconductor over a large temperature range. In comparison, the lead-free tetragonal BSCCO phase does not convert readily into (Bi,Pb)SCCO 2223. By controlling phase conversions, it is possible to make use of the advantages of the orthorhombic and tetragonal phases, by using the particular phase most suited to the operation to be performed. Methods of controlling the phase composition of the precursor powder during its preparation and during subsequent thermomechanical processing, are described, for example in U.S. patent application Ser. No. 08/467,033 (U.S. '033) filed Jun. 6, 1995 and entitled "Processing of (Bi,Pb)SCCO Superconductor in Tapes and Wires", which is herein incorporated in its entirety by reference. In the process described in U.S. '033, an elongated BSCCO superconducting article is manufactured by first heating a mixture of raw materials of a desired ratio of constituent metallic elements corresponding to a final superconducting BSCCO material at a first selected processing temperature in an inert atmosphere with a first selected oxygen partial pressure for a first selected time period. The first processing temperature and partial pressure are cooperatively selected to form a dominant amount of certain desired BSCCO precursor phases, preferably including a tetragonal BSCCO 2212 phase, along with the secondary phases necessary for the production of the desired final superconducting phases, in the reacted mixture. A composite article may be formed using this reacted precursor powder substantially surrounded by a constraining metal matrix. Prior to the texture-inducing deformation operation, the article is subjected to a heat treatment at a second selected processing temperature in an inert atmosphere with a second selected oxygen partial pressure for a second selected time period which favors conversion of the tetragonal BSCCO phase into the corresponding orthorhombic BSCCO 2212 phase, so as to form a dominant amount of an orthorhombic BSCCO 2212 phase in the reacted mixture. Thereafter, the multifilamentary article is textured by deformation and thermally processed into a BSCCO 2223 oxide superconductor article. Selection of appropriate processing conditions, for example as described in Luo et al., "Kinetics and Mechanism of the $(Bi,Pb)_2Sr_2Ca_2Cu_3O_{10}$ Formation Reaction in Silver-Sheathed Wires," Applied Superconductivity, Vol. 1, No. 1/2, pp. 101–107 (1993), will allow the BSCCO 2223 to substantially inherit the texture, whether orthorhombic or tetragonal, of its 2212 precursor phase.

Reference to the "orthorhombic phase" and the "tetragonal phase" recognizes the existence of two crystallographic structures for BSCCO superconducting materials, the tetragonal and the orthorhombic structures. The tetragonal structure has equivalent a and b axes with a lattice parameter of about 5.4 angstroms. The conversion of the tetragonal to the orthorhombic structure corresponds to the formation of an oxygen deficient structure with a and b axes which are unequal in length. See, Jeremie et al in Supercond. Sci. Technol. 6 (1993) pages 730 through 735, which is herein incorporated by reference in its entirety. The conversion occurs simultaneously with the incorporation of a substituent having a variable oxidation state, i.e., Pb or Sb, into the BSCCO structure. Thus the formation of the orthorhombic phase is indicative of the reaction of the dopant carrier. The conversion is indicated by the broadening (and under some conditions, complete splitting) of the XRD 200 and 020 peaks at 33° (2θ).

As compared to certain prior art approaches, this process provides a method for preparing precursor powders having a controlled phase composition in a single step reaction process, and improved phase control during subsequent thermomechanical processing. However, it has been found that when the tetragonal to orthorhombic phase conversion is performed in multifilamentary composite precursors, processing inhomogeneities tend to occur and blister-like defects frequently form, both of which can adversely affect the $J_c$ performance of the desired superconducting composite article. The inventors believe that during the composite precursor fabrication stage, the mechanical force applied to reduce the cross-section of the multifilamentary precursor will tend to work to a greater degree on the filaments in the outer portions of the precursor and cause an inhomogeneous stress distribution, both through the diameter of the precursor and along its length. Therefore, the outer filaments and their surrounding matrix material will deform more than those near the center of the precursor, creating a distribution of differently sized filaments. Further, the inhomogeneous stress distribution creates filament slippages, breaks and other defects in the filaments. During the composite precursor fabrication stage, the multifilamentary precursor also tends to absorb gas and moisture which becomes trapped, creating blisters, particularly in the filaments and at the interfaces between the filaments and the surrounding metal matrix. These problems are characteristic of PIT processes generally, but they are exacerbated during processes requiring high temperature treatments and oxygen release, such as the tetragonal to orthorhombic phase transformation. Significant amounts of oxygen must be released from the filaments during the formation of the oxygen-deficient structure which characterizes the orthorhombic phase, and removed by diffusion through the matrix material. If the cross-sections of the filaments and surrounding matrix material are non-uniform, the phase transformation cannot proceed uniformly and undesired phases will result. The positive pressure inside the blisters will tend to prevent oxygen release from the adjacent filaments causing additional inhomogeneities in the phase transformations. Moreover, during the high temperature phase conversion, the gas in the blisters will tend to expand and water and other condensed phases will volatize so the blisters will grow significantly in size, hindering subsequent processing steps.

It is desirable to provide a process which provides improved powder phase control coupled with improved oxygen control and defect management during tetragonal to orthorhombic phase conversions. It is also desirable to provide a superconducting composite article with reduced defect levels and improved $J_c$ performance.

SUMMARY OF THE INVENTION

The present invention provides a means of controlling the phase composition of a precursor powder for the BSCCO superconducting materials, particularly Pb-doped BSCCO materials, with selected primary and secondary phases during those thermomechanical processing steps which occur inside the composite precursor, while minimizing formation of blisters and other defects in the composite. In general, the method includes the steps of consolidating the multifilamentary composite precursor during the composite precursor fabrication stage in order to promote grain growth of the constraining metal at the interfaces between said metal and said filaments and eliminate voids in the article, and subsequently performing one or more oxygen-releasing phase conversions inside the composite precursor under conditions of time, temperature and oxygen partial pressure cooperatively selected to promote the growth of desired powder phases while controlling the rate of oxygen release from the composite. A consolidation step is performed after at least the last rebundling step and consolidation is completed before any high strain longitudinal deformation of the bundle.

In one aspect of the present invention, an elongated BSCCO, (preferably Pb-doped BSCCO) superconducting article is manufactured by first heating a mixture of raw materials of a desired ratio of constituent metallic elements corresponding to a final superconducting BSCCO material at a first selected processing temperature in an inert atmosphere with a first selected oxygen partial pressure for a first selected time period. The first processing temperature and partial pressure are cooperatively selected to form a dominant amount of certain selected intermediate phases having a dominant amount of a tetragonal BSCCO phase in the reacted mixture. A billet is then formed which is comprised of the reacted mixture substantially surrounded by a constraining metal, and a bundle is then formed including a plurality of billets. Next, the bundle is thermomechanically consolidated by applying heat and pressure under conditions cooperatively selected to cause interdiffusion of the constraining metal at the interfaces between said metal and said filaments and substantially complete elimination of voids in the article, and consolidation is completed before any high strain longitudinal deformation is performed on the bundle. The article is then heated at a second selected processing temperature in an inert atmosphere with a second selected oxygen partial pressure for a second selected time period cooperatively selected to form a dominant amount of an orthorhombic BSCCO phase in the reacted mixture. A texture-inducing deformation is performed on the article to form an elongated precursor article of a desired texture. In a preferred embodiment, the elongated precursor article is then heated at a third selected processing temperature in an inert atmosphere with a third selected oxygen partial pressure for a third selected time period. The third processing temperature and the third oxygen partial pressure are cooperatively selected to convert at least a portion of the orthorhombic BSCCO phase to the final superconducting BSCCO material, and preferably to create a dominant about of the final superconducting BSCCO material.

In another aspect of the invention, a novel process for the production and processing of high quality, high $T_c$ BSCCO superconductors, preferably Pb-doped BSCCO superconductors, starts with fabrication of a bundle including a plurality of billets, each billet containing at least one filament comprising a dominant amount of an tetragonal BSCCO phase with selected intermediate phases, and substantially surrounded by a constraining metal. Next, the bundle is thermomechanically consolidated to form a multifilamentary precursor article by applying heat and pressure under conditions cooperatively selected to cause interdiffusion of the constraining metal at the interfaces between said metal and said filaments and substantially complete elimination of voids in the article, and consolidation is completed before any high strain longitudinal deformation is performed on the bundle. The article is then heated at a second selected processing temperature in an inert atmosphere with a second selected oxygen partial pressure for a second selected time period, the second processing temperature, the second time period and the second oxygen partial pressure being cooperatively selected to form a dominant amount of an orthorhombic BSCCO phase in the reacted mixture. In preferred embodiments, a texture-inducing deformation is performed on the article to form an elongated precursor article of a desired texture; and the article is thereafter heated at a third selected processing temperature in an inert atmosphere with a third selected oxygen partial pressure for a third selected time period, all cooperatively selected to convert at least a portion of the orthorhombic BSCCO phase to the final superconducting BSCCO material, and preferably to create a dominant about of the final superconducting BSCCO material.

By "final BSCCO superconducting material", as that term is used herein, it is meant the chemical composition and solid state structure of the superconducting material after all processing of the precursor is completed. It is typically, though not always, the oxide superconductor phase having the highest $T_c$ or $J_c$.

By "dominant amount" of a designated BSCCO phase, as that term is used herein, it is meant that the designated phase, such as a BSCCO-2223 phase, the orthorhombic BSCCO-2212 phase or the tetragonal BSCCO-2212 phase, is the dominant phase present in the precursor powder, as selected among the members of the homologous BSCCO series of oxide superconductor. A "dominant amount" includes more than 50 vol %, preferably more than 80 vol %, and most preferably, more than 95 vol % of the members of the homologous BSCCO series as the designated phase.

In a preferred embodiment, the final superconducting material includes a BSCCO-2223 phase. In another preferred embodiment, the final superconducting material includes a (Bi,Pb)SCCO-2223 phase. In another preferred embodiment, the dominant orthorhombic phase includes a BSCCO-2212 phase. In yet another preferred embodiment, the dominant orthorhombic phase includes a doped BSCCO-2212 phase, where the dopant substitutes for bismuth. The dopant may be, for example, lead (Pb) or antimony (Sb), and is preferably Pb.

The multifilamentary superconducting BSCCO article may be of any elongated shape or form. It is typically in tape or wire form as a constraining metal matrix surrounding a plurality of filaments, each comprising BSCCO powder. The metal is typically a noble metal or an alloy substantially comprising a noble metal. A noble metal is substantially inert to oxidation under conditions used in high temperature superconductor manufacture. By "alloy", as it is used herein is meant a solid solution or uniform dispersion of metals in one another, or a composite of a metal and a small amount of another substance. It may include oxide-dispersion strengthened (ODS) metals and alloys. Silver and silver alloys, including ODS silver, are preferred noble metals, while silver and high silver content alloys, containing at least 90% silver, are most preferred.

By "substantially complete elimination of voids" is meant that the average void fraction of closed pore space in the article, determined immediately after the consolidation step, is less than 5%, more preferably less than 3%, and most preferably less than 1%. The void fraction is calculated as the measured void space in the non-filament area of an article cross-section divided by the difference between the total non-filament area of the article cross-section.

By "high strain longitudinal deformation" is meant a longitudinal deformation such as drawing or rolling to a total reduction in the area of the perpendicular cross-section greater than 67% in one or more passes. By "low strain longitudinal deformation" is meant a longitudinal deformation such as drawing or rolling to a total reduction in the area of the perpendicular cross-section no greater than 67% in one or more passes. Since consolidation is completed before any high strain longitudinal deformation is performed on the bundle, longitudinal deformations performed on the bundle prior to and during the consolidation step (but after the completion of any prior consolidation step) may cumulatively reduce the perpendicular cross-sectional area of the bundle by no more than a total of about 67%.

In one aspect of the invention, the bundle is consolidated by simultaneously applying pressure and heat under conditions sufficient to substantially eliminate voids in the article without buckling the filaments, and to promote grain growth of the constraining metal. In a preferred embodiment, the bundle is consolidated by hot isostatic pressing in an inert gas, typically at a pressure in the range of about 3 atm. to about 999 atm., and a temperature in the range of about 200° C. to about 750° C. for a time in the range of about 1 hour to about 36 hours, where the matrix is silver or a high silver content alloy. Preferably, the bundle is hot isostatically pressed at a pressure in the range of about 3 atm. to about 420 atm., and a temperature in the range of about 200° C. to about 600° C., and most preferably, the bundle is hot isostatically pressed at a pressure in the range of about 3 atm. to about 140 atm., and a temperature in the range of about 300° C. to about 600° C.

In another aspect of the invention, the bundle is consolidated by applying one or more sequences of pressure followed immediately by heating to promote grain growth of the constraining metal. In a preferred embodiment of the invention, the heating step is a thermal anneal, typically performed at a pressure of about 1 atm. and a temperature in the range of about 400° C. to about 750° C. for a time in the range of about 5 minutes to about 50 hours where the matrix is silver or a high silver content alloy. A cold isostatic pressing step, under conditions sufficient to substantially eliminate voids in the article without buckling the filaments, is performed just before the thermal anneal. The article may be cold isostatically pressed in liquid pressurization media, air, or another gas at a pressure which is preferably in the range of about 10 atm. to about 2000 atm., and most preferably in the range of about 100 atm. to about 1100 atm., at about ambient temperature for a time in the range of about 5 minutes to about 100 hours.

In another preferred embodiment, the bundle is consolidated by one or more drawing sequences sufficient to substantially eliminate voids in the article without buckling the filaments, followed immediately by heating to promote grain growth in the constraining metal. The heating step is a thermal anneal, typically performed at a pressure of about 1 atm. and a temperature in the range of about 400° C. to about 750° C. for a time in the range of about 5 minutes to about 50 hours for silver or a high silver content alloy, and the drawing step is performed before the thermal anneal. In a preferred embodiment, the pressure step is drawing to a reduction such that the total area reduction of the bundle after it is formed but before the thermal anneal is substantially equal to the average void fraction of closed pore space in the bundle. In another preferred embodiment, the bundle is drawn to a total reduction in perpendicular cross-sectional area (including all other post-bundling, pre-consolidation reductions) of no more than 67%, and preferably between about 5% and about 50%, in 1 to 6 passes of about 5% to about 25% per pass, with optional intervening low temperature anneals, in the range of about 200 C. to 450 C. in air for 5 minutes to 2 hours, to reduce strain energy.

One or more iterations of the consolidation step may be performed on a bundle. In some embodiments, some or all of sealing, cleaning, evacuation or low strain deformation operations may be performed on the billets or bundles at any time before consolidation. If several bundling iterations are performed, a consolidation step may be performed after each bundling operation or once when the final bundle is assembled. In some embodiments, additional deformation and anneal cycles are performed on the article after it has been consolidated to further reduce the cross-section of the composite.

In a preferred embodiment, the second processing temperature, the second processing time and the second oxygen partial pressure are cooperatively selected such that their values are below the stability line defined by the minimum values at which the dominant BSCCO 2212 phase melts or decomposes, and above the stability line defined generally by the maximum values at which $Cu^{2+}$ decomposes to $Cu^+$. In a preferred embodiment, the dominant orthorhombic phase includes a Pb-doped BSCCO-2212 phase, the selected intermediate phases include $Pb^{4+}$ phases, and the second processing temperature, the second processing time and the second oxygen partial pressure are also cooperatively selected such that their values fall within the region where substantial portions of the $Pb^{+4}$ phases can be reduced to $Pb^{+2}$ phases. The $Pb^{+4}$ phases typically may include $(Ca_{2-x}Sr_x)PbO_4$ and $(Ca_{2-x-y}Sr_xCu_y)(Pb_{1-n}Bi_n)O_z$. In yet another preferred embodiment, the heating step includes maintaining the temperature of the mixture in a range of 650° C. to 870° C. and the oxygen partial pressure in a range of 1.0 atm $O_2$ to 0.0001 atm $O_2$, and preferably maintaining the temperature of the mixture in a range of 700° C. to 860° C. and the oxygen partial pressure in a range of 0.5 atm $O_2$ to 0.04 atm $O_2$, and most preferably maintaining the temperature of the mixture in a range of 740° C. to 850° C. and the oxygen partial pressure in a range of 0.21 atm $O_2$ to 0.04 atm $O_2$, for a time period of about 0.01 to about 10 hours.

In other preferred embodiments, the step of forming a dominant amount of a tetragonal BSCCO phase in the precursor powder is carried out at a first temperature in the range of 700–850° C. and a first oxygen partial pressure in the range of 0.04 atm to 1 atm.

In preferred embodiments, the texture-inducing deforming step is an asymmetric deformation such as rolling, pressing extruding or drawing through an aspected die or twisting. By "asymmetric deformation", it is meant any deformation which provides a substantial change in aspect ratio or shear strain in the material. By "longitudinal deformation" is meant any deformation which provides substantial increase in the length and decrease in the perpendicular cross-sectional area of the article. In another embodiment of the present invention, the texture-inducing deforming step and final oxide superconductor-forming heating step are sequentially repeated.

In a preferred embodiment, the third processing temperature, the third processing time and the third oxygen partial pressure are cooperatively selected such that their values are below the stability line defined by the minimum values at which the desired final BSCCO superconductor, preferably BSCCO 2223 or (Bi, Pb)SCCO 2223, melts or decomposes, and above the stability line defined by the minimum values at which the dominant orthorhombic BSCCO phase melts or decomposes. In other preferred embodiments, the final conversion step may alternatively preferably include heating at a temperature in the range of 800° C. to 845° C. and at an oxygen pressure in the range of 0.003 to 0.21 atm $O_2$. It may alternatively preferably include heating in a first step in the range of about 810–850° C.; heating in a second step in the range of about 780–840° C.; and heating in a third step in the range of about 600–800° C., said first, second and third heating steps at an oxygen pressure in the range of 0.003 to 0.21 atm $O_2$. It may alternatively preferably include heating at a first temperature in the range of 650° C. to 795° C. and at a first oxygen pressure in the range of 0.0001 to 0.075 atm $O_2$; and heating at a second temperature in the range of 800° C. to 845° C. and at a second oxygen pressure in the range of 0.003 to 0.21 atm $O_2$. It may also alternatively include heating at a first temperature in the range of 650° C. to 795° C. and at a first oxygen pressure in the range of 0.0001 to 0.075 atm $O_2$; and heating in a second step in the range of about 810–850° C.; heating in a third step in the range of about 780–840° C.; and heating in a fourth step in the range of about 600–800° C., said second, third and fourth heating steps at an oxygen pressure in the range of 0.003 to 0.21 atm $O_2$.

In yet another preferred embodiment, the final conversion step includes ramping through a temperature range and an oxygen partial pressure range, such that the temperature and oxygen partial pressure range cooperatively include a value at which the dominant orthorhombic BSCCO phase, preferably (Bi,Pb)SCCO 2212, decomposes. The ramping is at a rate sufficiently rapid such that the decomposition of the dominant orthorhombic BSCCO phase is kinetically disfavored. In a preferred embodiment, the ramp rate is greater than 0.1° C./min and most preferably is in the range of 0.1 to 100° C./min.

In another aspect of the present invention, a multifilamentary composite precursor for a superconducting article is provided comprising a constraining metal matrix surrounding a plurality of filaments each containing a dominant amount of a tetragonal BSCCO 2212 phase, characterized in that the filaments are substantially unbuckled and average void fraction of closed pore space in the precursor is less than 5%, preferably less than 3% and most preferably less than 1%.

In another aspect of the present invention, an elongated BSCCO superconducting article is manufactured by: first, fabricating a bundle including a plurality of billets, each billet comprising a constraining metal matrix surrounding one or more filaments comprising selected intermediate phases having a dominant amount of the tetragonal BSCCO phase. Next, the bundle is thermomechanically consolidated to form a multifilamentary precursor article by applying heat and pressure under conditions cooperatively selected to cause interdiffusion of the constraining metal at the interfaces between said metal and said filaments and substantially complete elimination of voids in the article, and consolidation is completed before any high strain longitudinal deformation is performed on the bundle. The article is heated at a second selected processing temperature in an inert atmosphere with a second selected oxygen partial pressure for a second selected time period, the second processing temperature, the second time period and the second oxygen partial pressure being cooperatively selected to form a dominant amount of an orthorhombic BSCCO phase in the reacted mixture. In preferred embodiments, a texture-inducing deformation is performed on the article to form an elongated precursor article of a desired texture; and the article is thereafter heated at a third selected processing temperature in an inert atmosphere with a third selected oxygen partial pressure for a third selected time period, all cooperatively selected to convert at least a portion of the orthorhombic BSCCO phase to the final superconducting BSCCO material.

In another aspect of the present invention, an elongated BSCCO superconducting article is manufactured by first heating a mixture of raw materials of a desired ratio of constituent metallic elements corresponding to a final superconducting BSCCO material at a first selected processing temperature in an inert atmosphere with a first selected oxygen partial pressure for a first selected time period. The first processing temperature and partial pressure are cooperatively selected to form a dominant amount of certain selected intermediate phases having a dominant amount of a tetragonal BSCCO phase in the reacted mixture. A billet is then formed which is comprised of the reacted mixture substantially surrounded by a constraining metal, and a bundle is then formed including a plurality of billets. Next, the bundle is thermomechanically consolidated by applying heat and pressure under conditions cooperatively selected to cause interdiffusion of the constraining metal at the interfaces between said metal and said filaments and substantially complete elimination of voids in the article, and consolidation is completed before any high strain longitudinal deformation is performed on the bundle. The article is heated at a second selected processing temperature in an inert atmosphere with a second selected oxygen partial pressure for a second selected time period cooperatively selected to form a dominant amount of an orthorhombic BSCCO phase in the reacted mixture. A texture-inducing deformation is performed on the article to form an elongated precursor article of a desired texture. In a preferred embodiment, the elongated precursor article is then heated at a third selected processing temperature in an inert atmosphere with a third selected oxygen partial pressure for a third selected time period. The third processing temperature and the third oxygen partial pressure are cooperatively selected to convert at least a portion of the orthorhombic BSCCO phase to the final superconducting BSCCO material.

In preferred embodiments, the final oxide superconductor comprises (Bi,Pb)SCCO 2223, the tetragonal BSCCO phase comprises tetragonal (Bi,Pb)SCCO 2212 and the orthorhombic BSCCO phase comprises orthorhombic (Bi,Pb)SCCO 2212. In other preferred embodiments, the final oxide superconductor comprises BSCCO 2223, the tetragonal BSCCO phase comprises tetragonal BSCCO 2212 and the orthorhombic BSCCO phase comprises orthorhombic BSCCO 2212.

DETAILED DESCRIPTION OF THE INVENTION

Figure 1:
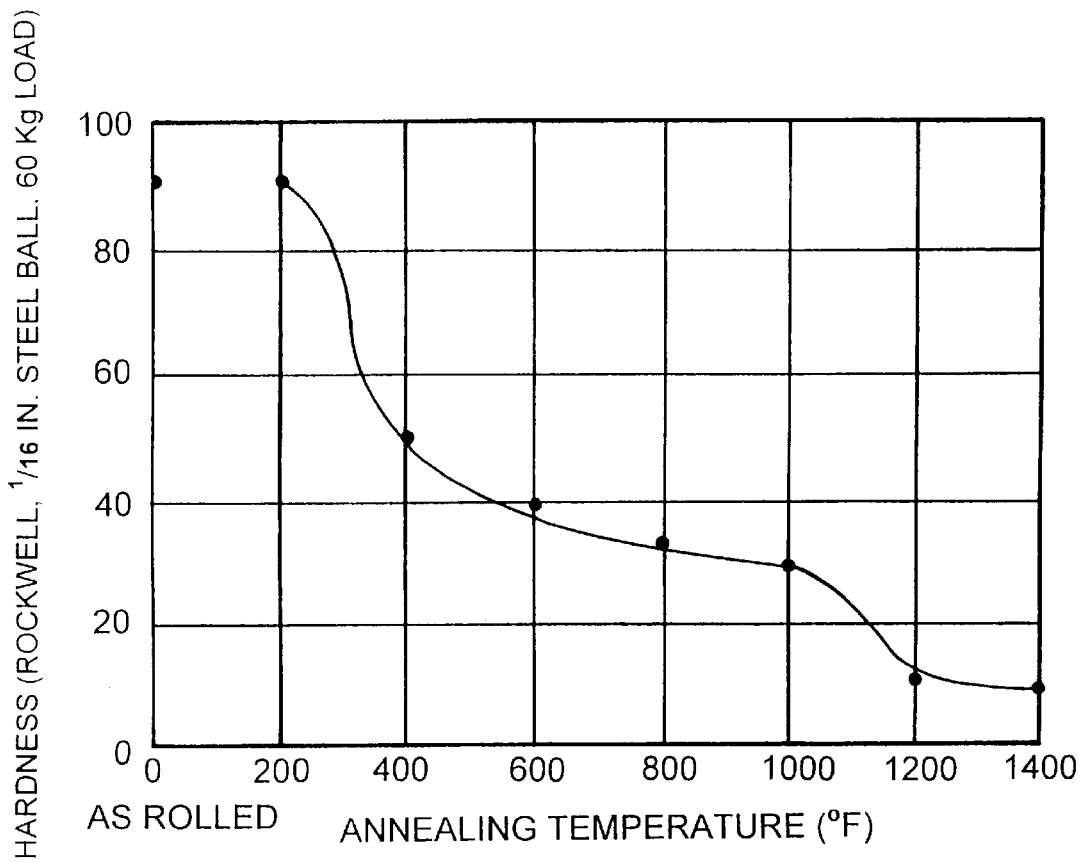
FIG. 1 (prior art) depicts the effect of annealing temperature on the room-temperature hardness of 0.032 in. thick silver sheet.

The present invention provides improvements in managing phase conversions during the manufacture of high temperature superconducting composite articles from multifilamentary composite precursors using PIT processes. In general, the method includes the steps of consolidating a bundle of billets to form the multifilamentary composite precursor in order to promote grain growth of the constraining metal at the interfaces between the metal and the filaments and to eliminate voids in the precursor, completing the consolidation before any high strain longitudinal deformation is performed on the bundle, and subsequently performing one or more oxygen-releasing phase conversions inside the composite precursor under conditions of time, temperature and oxygen partial pressure cooperatively selected to promote the growth of desired powder phases while controlling the rate of oxygen release from the composite.

In preferred embodiments, the method provides a composite precursor article including a precursor powder which contains a dominant amount of an orthorhombic BSCCO phase, without formation of undesirable defects in the composite. The orthorhombic BSCCO phase typically may include BSCCO 2212. It may also include a doped BSCCO 2212 such as, by way of example only, (Bi,Pb)SCCO 2212 or (Bi,Sb)SCCO. The addition of a dopant to the BSCCO phase is believed to promote the conversion of the tetragonal BSCCO phase to the more desirable orthorhombic BSCCO 2212 phase under the reaction conditions of the present invention. According to the method of the present invention, undesirable secondary phases are also minimized. By "undesirable secondary phase", as that term is used herein, it is meant phases in the precursor powder which do not promote or which hinder the conversion of the original precursor powder through the selected intermediate BSCCO phases into the final BSCCO superconducting material. "Undesirable" secondary phases are contrasted to "desirable" secondary phases, the latter of which are necessary for one or more of the desired conversions. Secondary phases which are considered desirable secondary phases when they occur with the orthorhombic phase include, for example, alkaline earth cuprates and copper oxides which react with the orthorhombic BSCCO phase to form a higher order family member of the BSCCO homologous series of superconducting oxides. For a Pb-doped final superconducting material, secondary phases which are considered desirable second phases when they occur with the tetragonal phase include, for example, the $Pb^{+4}$ phases such as $(Ca_{2-x}Sr_x)PbO_4$ and $(Ca_{2-x-y}Sr_xCu_y)(Pb_{1-n}Bi_n)O_z$, the latter of which is commonly known as the "3221 phase". "Undesirable secondary phases" may include unreacted metal oxides, such as alkaline earth bismuthates or the 3221 phase, or lower members of the homologous series of which the final BSCCO superconductor is a member, for example, BSCCO 2201. It will be seen that the desirability or undesirability of a secondary phase can depend on when it occurs and in what amount as well as on the composition of the secondary phase.

In the precursor powder formation stage of the PIT process, a raw powder mixture is produced by mixing appropriate amounts of raw powder in a stoichiometry suitable for production of a desired final superconducting material. Suitable raw powders include, but are not limited to, oxides, carbonates, nitrides, oxalates, alkoxides or nitrates of Bi, Sr, Ca and Cu, and optionally Pb or Sb. After thoroughly mixing the raw materials, the mixture is typically subjected to multiple heating and grinding steps in order to obtain a uniform mixture of the metallic elements, reduce the particle size and eliminate by-products such as oxides of nitrogen or carbon. Depending on the starting material and the particle size, there are usually one to four initial heating and grinding steps. Typically, the raw powders are heated at a temperature in the range of 350° C. to 850° C., in air or oxygen atmosphere, followed by grinding of the powder to a small particle size. Alloying of the constituent metallic elements of the final oxide superconductor is also contemplated within the scope of the present invention.

Next, the raw powder in the composite precursor may be thermally converted into the tetragonal (Bi,Pb) SCCO 2212 phase plus secondary phases by heating at a first selected processing temperature in an inert atmosphere with a first selected oxygen partial pressure for a first selected time period. The first processing temperature and first oxygen partial pressure are cooperatively selected to form a dominant amount of a tetragonal BSCCO phase in the reacted mixture. Preferably, this step is carried out at a first processing temperature in the range of 700° C. to 850° C. and a first oxygen partial pressure in the range of 0.04 atm to 1 atm. The mixture of the primary (Bi,Pb)SCCO 2212 phase and the secondary phases forms a precursor powder which may be used for production of BSCCO or (Bi,Pb)SCCO 2223 or 2212 superconducting articles such as wires and tapes.

According to the method of the invention, several monofilamentary billets, each comprising a noble metal layer surrounding the filament space, are packed with the precursor powder, and then gathered in one or more iterations to form a multifilamentary bundle. Typically, the bundle is gathered into a metal sheath, but this is not always the case. Before any high strain longitudinal deformation of the bundle, the bundle is thermomechanically consolidated to form a multifilamentary precursor article by applying heat and pressure under conditions cooperatively selected to cause interdiffusion of the constraining metal at the interfaces between the metal and the filaments and substantially complete elimination of voids in the article. If several bundling iterations are performed, a consolidation step may be performed after each bundling operation or once after the final bundle is assembled. Various sealing, cleaning and evacuation operations, all well known in the art, may optionally be performed on the billets or bundles at any time before consolidation. It is preferred that the bundle be cleaned by a method such as evacuation or bake-out immediately prior to consolidation. Certain longitudinal deformations may also optionally be performed. Before any bundling takes place, longitudinal, axisymmetric deformations with low temperature anneals may be performed on the monofilamentary billets at any desired strain level within the tolerance of the metal. After any bundling operation, but before the next consolidation step, low strain longitudinal deformations with optional low temperature anneals may be performed, but the cumulative cross-sectional area reduction from these deformations and any longitudinal deformations which take place during the consolidation step may not exceed about 67%. For example, monofilamentary billets may be fabricated and elongated by multiple die passes through hexagonally shaped dies of varying sizes to form silver sheathed (Bi,Pb)SCCO hexagonal wire billets. In accordance with the invention, several of the hexagonal wire billets may be bundled together and drawn through a round die at a reduction in cross-sectional area of 25% to form a multi-filamentary round wire, which is then consolidated by hot isostatic pressing, drawn to a reduction in cross-sectional area of 75%, rebundled with a number of identical wires in a silver alloy tube, redrawn at a reduction in cross-sectional area of 25%, and consolidated a second time, also by hot isostatic pressing. Alternatively, several of the hexagonal wire billets may be bundled together and drawn through a round die at a reduction in cross-sectional area of 5% to form a multi-filamentary round wire, which is then rebundled in a silver tube without consolidation, redrawn at a reduction in cross-sectional area of 5%, and consolidated by a sequence which includes additional drawing, but to cumulative reduction in cross-sectional area which, taken with all prior multifilament drawing steps, is less than 67%. High strain longitudinal deformations should not be performed before consolidation of the bundle is completed, as they have been found to create blisters, filament inhomogeneities, and mechanical defects. After the consolidation step on a particular bundle has been completed, high strain longitudinal deformation may be performed on it substantially without creating these problems.

Figure 2:
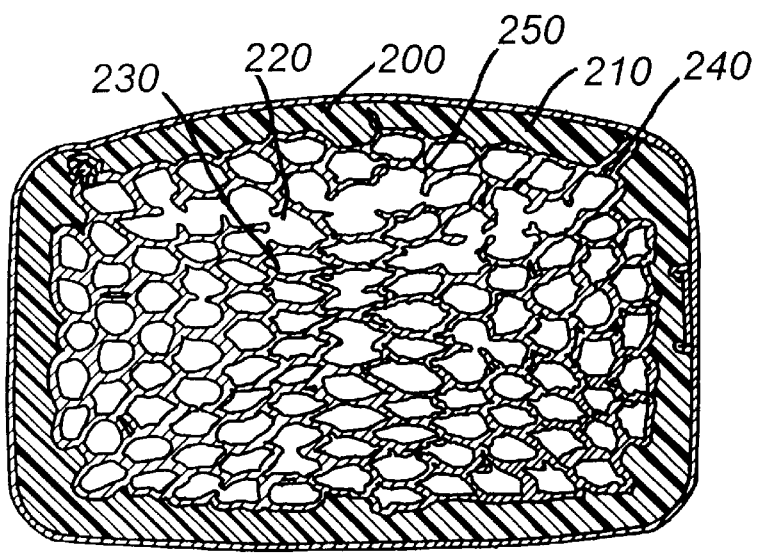
FIG. 2 (prior art) is an enlarged photograph showing the perpendicular cross-section of an unconsolidated precursor immediately after the tetragonal to orthorhombic conversion step, showing non-uniform filament cross-sections and epoxy-filled cracking defects.
Figure 3:
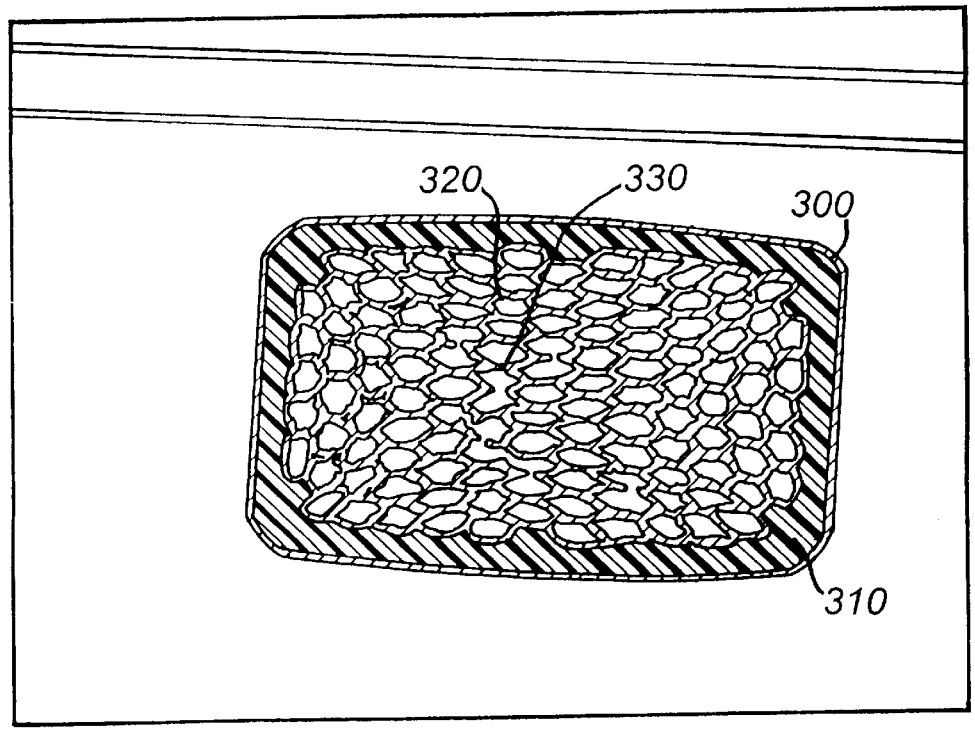
FIG. 3 is an enlarged photograph showing the perpendicular cross-section of a consolidated precursor processed in accordance with the invention, immediately after the tetragonal to orthorhombic conversion step.
Figure 4:
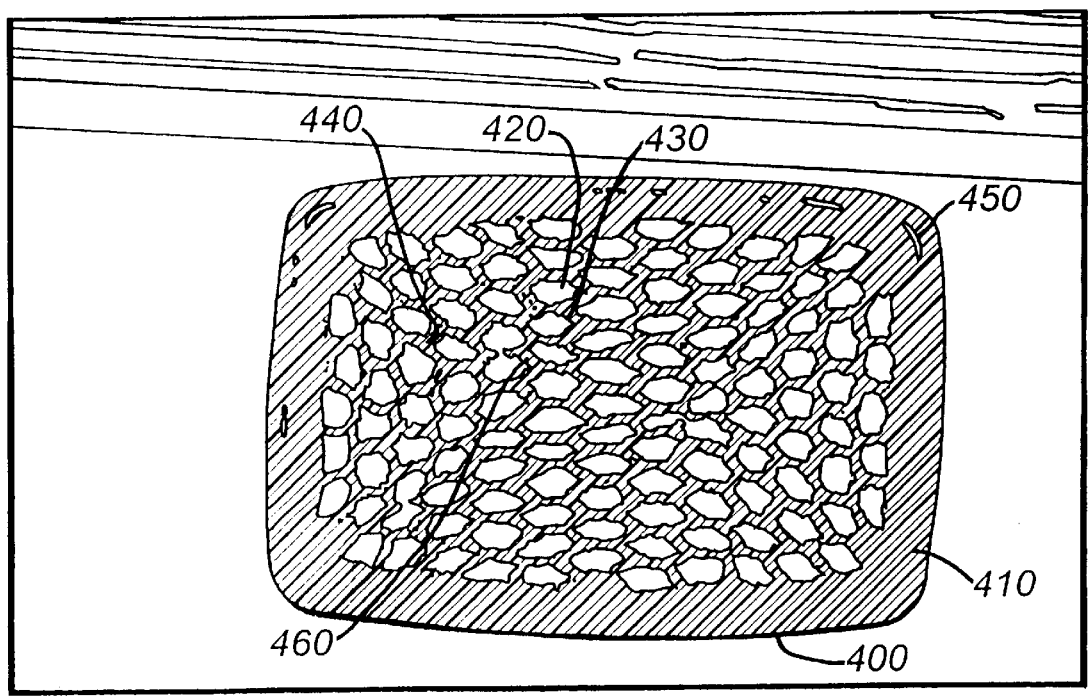
FIG. 4 (prior art) is an enlarged photograph showing the perpendicular cross-section of an unconsolidated precursor immediately after the tetragonal to orthorhombic conversion step, showing non-uniform filament cross-sections and blister defects.

The goals of consolidation are to eliminate the voids which can trap gas or moisture to become blisters and to bond all filaments together with the constraining metal matrix so that subsequent deformations will induce homogeneous mass flow in the composite. Because the filled billets themselves have only a single, symmetric, internal (metal to powder) interface, the local displacements which cause defects will not be created even by high strain axisymmetric deformations. In contrast, multifilamentary bundles have multiple internal interfaces (both metal to metal and metal to powder) which, when deformed, are likely to create local displacements not reflected in the bundle as a whole. Without consolidation, the bundle will tend to slip at the interfaces between the filaments and the matrix, and also at the interfaces between billets during deformation, causing radially non-uniform stresses which preferentially deform certain filaments near the outer radius of the composite precursor, and may create mechanical defects such as cracks in the composite precursor. FIGS. 2 and 4 (prior art) are photographs, showing perpendicular cross-sections of two unconsolidated precursors processed in accordance with prior art methods immediately after their tetragonal to orthorhombic conversion, showing non-uniform filament cross-sections and defect. Both photographs are enlarged to the same scale, and the enlargement scale (50×) of 200 μm per cm is shown in FIG. 2. In FIG. 2, composite precursor 200 comprises matrix metal 210 surrounding filaments 220 and 230. Cracks 240 and 250, which have been filled with epoxy for better contrast in the photograph, have been formed by non-uniform stresses on the composite precursor. In FIG. 4, composite precursor 400 comprises matrix metal 410 surrounding filaments 420 and 430. Blisters 440, 450 and 460 have been formed by the expansion of trapped gas and moisture in the composite precursor. It will be seen that blisters such as 440 have formed in the matrix metal between filaments, blisters such as 450 have formed in the outer portion of the metal where the billets were rebundled and blisters such as 460 have formed at the interfaces between the filaments and the metal. FIG. 3 is an enlarged photograph, showing a perpendicular cross-section of a consolidated precursor processed in accordance with the invention, and shown immediately after the tetragonal to orthorhombic conversion step showing more uniform filament cross-sections and fewer defects than the precursors shown in FIGS. 2 and 4. The photograph is enlarged to the same scale as FIGS. 2 and 4, and the enlargement scale of 200 μm per cm is shown in FIG. 3. In FIG. 3, composite precursor 300 comprises matrix metal 310 surrounding filaments 320 and 330. Filaments 320 and 330 have more uniform cross-sections than filaments 220 and 230.

Increasing the homogeneity of the mass flow creates a more uniform distribution of stresses and therefore of filament cross-sections through the cross-section of the precursor. During subsequent phase conversions, the more homogeneous structure can be processed more uniformly.

The article is thermomechanically consolidated by applying heat and pressure under conditions cooperatively selected to cause interdiffusion of the constraining metal matrix at the interfaces between the metal and the filaments by grain growth of the metal, and substantially complete elimination of voids in the article. Sufficient heat must be applied to the composite precursor to promote recrystallization and growth of the grains of noble metal. For silver and alloys comprising at least about 90% silver, this typically means temperatures above about 400° C. at 1 atm pressure, although lower temperatures may be used at higher pressures.

A bundle may be consolidated by applying pressure and heat either simultaneously or sequentially, but if they are applied sequentially, the pressure must precede the heat in order for the necessary grain growth and interdiffusion to occur. One or more iterations of the consolidation step may be performed on a bundle. After a consolidation step, additional reduction passes may optionally be performed to further reduce the cross-section of the composite.

In a preferred embodiment, the composite precursor is consolidated by hot isostatic pressing. The hot isostatic pressing step is performed under conditions sufficient to substantially eliminate voids in the article without buckling the filaments. For silver and high silver content alloy matrix metals, consolidation by hot isostatic pressing may typically be done in an inert atmosphere at a pressure in the range of about 3 atm. to about 999 atm., and a temperature in the range of about 200° C. to about 750° C. for a time in the range of about 1 hour to about 36 hours. Preferably, the composite precursor is hot isostatically pressed at a pressure in the range of about 3 atm. to about 420 atm., and a temperature in the range of about 200° C. to about 600° C., and most preferably, the composite precursor is hot isostatically pressed at a pressure in the range of about 3 atm. to about 140 atm., and a temperature in the range of about 300° C. to about 600° C.

In another preferred embodiment of the invention, the consolidation heating step is a thermal anneal. For silver and high silver content alloy matrix metals, the thermal anneal may typically be performed at a pressure of about 1 atm. and a temperature in the range of about 400° C. to about 750° C. for a time in the range of about 5 minutes to about 50 hours. A consolidation pressure step, preferably cold isostatic pressing or drawing, is performed just before the thermal anneal. The cold isostatic pressing step is performed under conditions sufficient to substantially eliminate voids in the article without buckling the filaments. For silver and high silver content alloy matrix metals, the composite precursor may be cold isostatically pressed, in liquid pressurization media, air or another gas, at a pressure in the range of about 10 atm. to about 2000 atm., and preferably in the range of about 100 atm. to about 1100 atm., at about ambient temperature for a time in the range of about 5 minutes to about 100 hours.

In another preferred embodiment, the bundle is consolidated by one or more drawing sequences sufficient to substantially eliminate voids in the article without buckling the filaments, followed immediately by heating to promote grain growth in the metal. Heating is preferably performed by a thermal anneal under the conditions described above. In a preferred embodiment, the pressure step is drawing to a reduction such that the total area reduction of the bundle after it is formed but before the thermal anneal is substantially equal to the average void fraction of closed pore space in the bundle. In another preferred embodiment, the bundle is drawn to a total reduction in cross-sectional area, which taken together with any post-bundling, pre-consolidation longitudinal reductions, equals no more than 67%. Preferably the total reduction in cross-sectional area is between about 5% and about 50%, in 1 to 6 passes of about 5% to about 25% per pass, with optional intervening low temperature anneals, in the range of about 200° C. to 450° C. in air for 5 minutes to 2 hours.

Upon consolidation, the powder mixture is reacted in the composite precursor via a second heat treatment in accordance with the present invention, to form a precursor powder which includes a dominant amount of an orthorhombic BSCCO phase. It is preferred that the conditions of the consolidation step be chosen so as not to substantially modify the phase composition of the powder mixture during that step. Processing temperature, time and oxygen partial pressure for the second heat treatment are selected such that the formation of an orthorhombic BSCCO phase (among the other possible BSCCO phases) will dominate. It is, of course, contemplated that secondary phases necessary for the conversion of the orthorhombic BSCCO phase into the final superconducting phase may be present in the precursor phase.

In a preferred embodiment, the second processing temperature, Tp, second oxygen partial pressure, P(O2), and second processing time, tp, are cooperatively selected such that their values are below the stability line defined by the minimum values at which the dominant BSCCO 2212 phase melts or decomposes, and above the stability line defined generally by the maximum values at which $Cu^{2+}$ decomposes to $Cu^+$. The inventors have found that the invention may be practiced under a wide range of conditions for the second oxygen partial pressure, P(O2). Relatively high P(O2) conditions, typically higher than those taught in U.S. '033, are preferred. With appropriate selection of processing temperatures and times, the high P(O2) conditions provide slower kinetics, which provide better control of manufacturing conditions for the composite. Furthermore, the range of conditions over which optimal electrical performances can be obtained tends to be wider at higher P(O2) conditions, an important consideration in long-length manufacturing processes.

Figure 7:
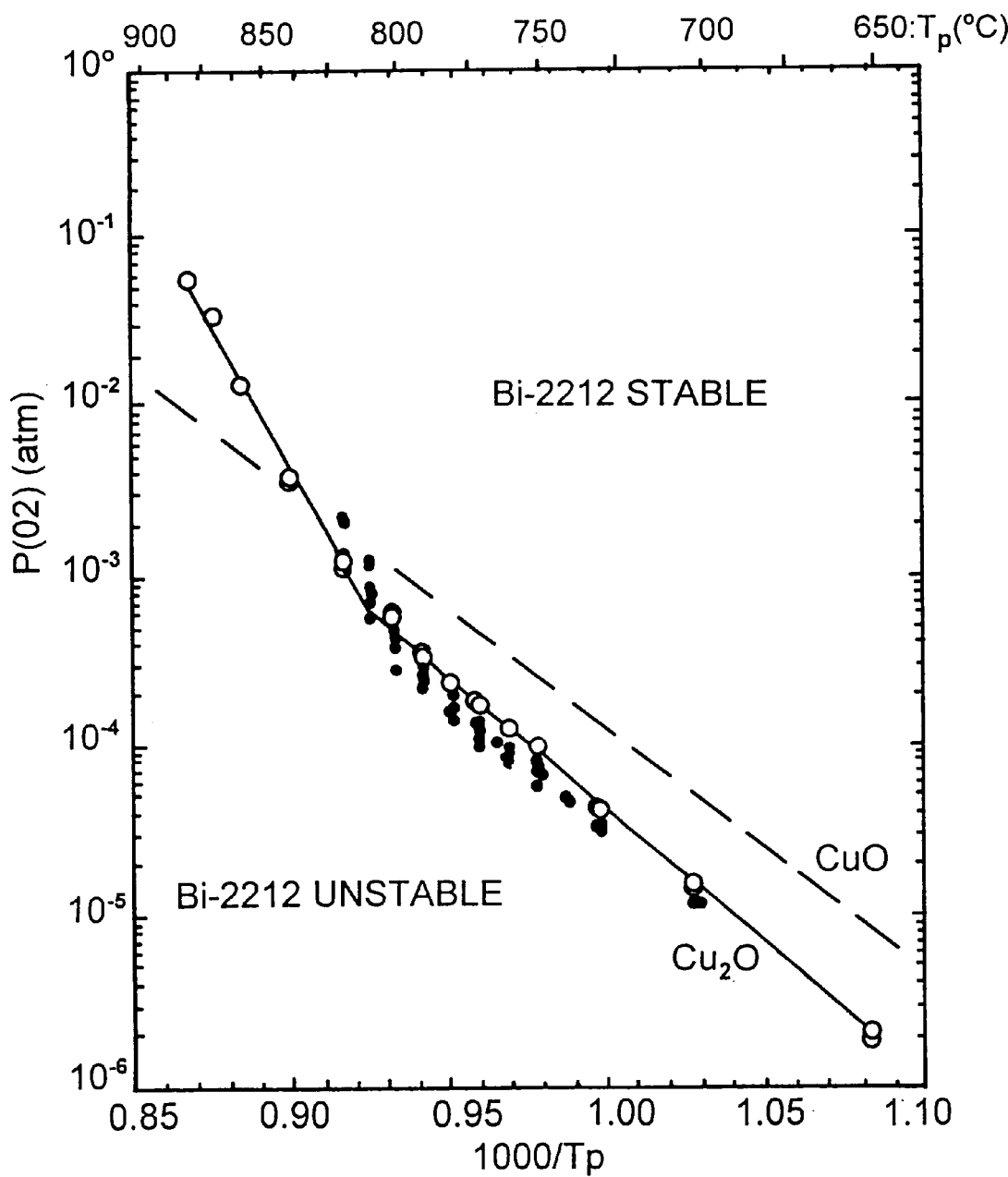
FIG. 7 (prior art) depicts the lower limit of p(O2) as a function of temperature for the orthorhombic phase stability region of BSCCO 2212.

The region of the pressure-temperature diagram in which the orthorhombic BSCCO phase is favored is denoted the "orthorhombic phase stability region". In Bi-2223 precursor powder, there are other reactions that can occur simultaneously with the tetragonal to orthorhombic phase conversion and are detrimental to subsequent formation of the desired product in latter stages of processing. Some of the reaction kinetics are different inside the composite than they are in powder. These reactions thus limit the actual ranges of p(O2) and temperature that can practically be used to produce a precursor powder that can be used for obtaining composites including final superconducting material with desirable properties. The lower limit of p(O2) is defined by the stability line for the reduction of $Cu^2$ to $Cu^+$ as illustrated in FIG. 7. Since this reaction also has a p(O2) and Tp dependence, it can be used to establish the lower thermodynamically stable p(O2) level at any given temperature. The upper limit of pO2 is defined by the stability line for the Bi-2212 phase which is generally associated decomposition and melting of the Bi-2212. This limit is also a function of pO2 and temperature. By operating in a processing regime which is bracketed by these values, phase composition of the precursor powder can be controlled and optimized.

Typical precursor powders for the Bi(Pb)-2223 system generally contain $Pb^{4+}$ phases with compositions of $(Ca_{2-x-y}Sr_xCu_y)(Pb_{1-n}Bi_n)O_z$ (commonly referred to as the 3221 phase), and $(Ca_{2-x}Sr_x)PbO_4$. The conversion to the orthorhombic phase requires thermodynamic conditions that result in the reduction of a substantial portion of the $Pb^{4+}$ to $Pb^{2+}$ in these compositions. Thus, in addition to the constraints discussed above, conditions of oxygen partial pressure, p(O2), processing temperature, Tp, and time, tp, such that this reduction will occur must be selected. Although all of the $Pb^{4+}$ can be reduced to $Pb^{2+}$, it is also acceptable if a small amount of the $Pb^{4+}$ remains in the final powder matrix. Depending on the exact composition of the $Pb^{4+}$ phases [i.e., $(Ca_{2-x}Sr_x)PbO_4$ or $(Ca_{2-x-y}Sr_xCu_y)(Pb_{1-n}Bi_n)O_z$] the actual thermodynamic and/or kinetic conditions may differ slightly. Generally, the $Pb^{2+}$ that forms is incorporated into the 2212 phase resulting in a continuous change of the lattice parameters of the 2212 from a tetragonal structure in which the a and b lattice parameters are equal to an orthorhombic structure in which they are not. The actual change in lattice parameters is a function of the Pb content in the 2212 lattice. The reduction of the $Pb^4+$ phases to $Pb^{2+}$ phases has a dependence on both the oxygen partial pressure and the processing temperature, thus a range of conditions can be used to effectively carry out the orthorhombic conversion process. As the oxygen partial pressure increases, the temperature must also increase.

According to the method of the invention, the powder may be heated to a second processing temperature, Tp, in the range of 650° C. to 870° C. in a controlled atmosphere of an inert gas and a second selected oxygen partial pressure, P(O2), between 1.0 atm $O_2$ and 0.0001 atm $O_2$. Suitable inert gases include, by way of example only, nitrogen and argon. In a preferred embodiment, the heating step includes maintaining the temperature of the mixture in a range of 700° C. to 860° C. and the oxygen partial pressure in a range of 0.5 atm $O_2$ to 0.04 atm $O_2$, and most preferably maintaining the temperature of the mixture in a range of 740° C. to 850° C. and the oxygen partial pressure in a range of 0.21 atm $O_2$ to 0.04 atm $O_2$. The temperature may be increased at a ramp rate between 0.5° C. per minute and 200° C. per minute up to the processing temperature, Tp, and the mixture may be kept at Tp for a second time period of about 0.01 hours to about 10 hours, and preferably about 5 minutes to about 100 minutes.

The appropriate values for Tp and P(O2) may be selected by monitoring the effect of processing conditions by XRD. The presence of the orthorhombic structure is indicated by the broadening or, under some conditions, splitting of the XRD peak at 33° (2θ). In the related tetragonal structure, the XRD 200 and 020 peaks at 330° (2θ) appears as a singlet. These differences in the x-ray diffraction pattern reflect the real structural differences in the two phases. The two phases further may be distinguished by comparison of their lattice parameters. As the conversion proceeds, a continuous change in the average values of the lattice parameters of the 2212 occurs, from a tetragonal structure in which the a and b lattice parameters are equal and have a defined value, to an orthorhombic structure in which this is not the case. A decrease in the c-axis value of the orthorhombic structure as compared to the tetragonal structure has also been reported. Furthermore, P(O2) and Tp control the relative formation of metal oxide secondary phases, including $(Sr_xCa_{1-y})CuO_z$ $(Sr_xCa_{1-x})_2CuO_3$, CuO, CaO, and $Cu_2O$. In a preferred embodiment, the 3221 present during the tetragonal phase disappears during the conversion to the orthorhombic phase, and the absence of 3221 is an indicator that the conversion has been performed.

The composite may be textured using one or more texturing deformation steps. The "texturing deformation" steps induce texturing of the selected orthorhombic phase of the precursor powder contained in the composite. Texture-inducing deformation typically is asymmetric deformation, by which it is meant any deformation which provides a substantial change in aspect ratio or a shear strain in the material, for example, extruding through an aspected die, twisting, rolling or pressing. The strain applied during the deformation improves the grain alignment for each iteration. The rolling process may be replaced by any asymmetric texturing process. Thermal annealing may be used after any significant mechanical deformation or reshaping of the superconducting composite for improvement of mechanical properties. Advantageously, the anneal may be performed at processing conditions (Tp, tp, P(O2)) selected to prevent the reconversion of the orthorhombic 2212 phase to the tetragonal 2212 phase in order to preserve the advantages of the selected phases of the starting precursor powder, i.e., in the orthorhombic BSCCO phase stability region of the pressure-temperature diagram. Any thermal processing of the composite can result in changes in the phase content of the precursor powder. Thus it is always desirable to control the selected phase content of the precursor powder in the composite by cooperatively selecting the oxygen partial pressure and the temperature of any heating process such that the oxidation states of the constituent elements of the selected primary phase are not changed in an undesired direction.

Further, it appears that oxide superconductor articles which have been subjected to the heat treatment of the invention after forming the composite article (powder packing and extrusion of the article), but before texturing deformation, exhibit improved electrical properties. It has also been observed that composite articles which have been prepared from precursor powders having a dominant orthorhombic BSCCO phase benefit from a heat treatment before the texture-inducing deformation operation. The heat treatment may be carried out under conditions that favor the formation of the orthorhombic BSCCO phase. The heat treatment is not necessarily for the purpose of forming the orthorhombic phase (since a dominant amount of the orthorhombic phase already is present). The heat treatment apparently relieves strain energy introduced into the article by previous wire formation operations, i.e., wire drawing and/or extrusion. It is possible that such phase modification releases the previous deformation-induced defects, e.g. dislocation, in addition to obtaining a homogeneous phase conversion.

Once the temperature is sufficiently high, the partial pressure of $O_2$ may be continuously or abruptly modified to the value used for the conversion of the precursor to the final oxide superconductor. The selected conversion temperature, $T_f$, preferably in the range of 800° C. to 845° C., may be reached at a ramp rate in the range of 0.5° C. per minute to 10° C. per minute. The tape is maintained at $T_f$ for about 1 to 60 hours to form the desired 2223 phase. Then, the superconducting tape is cooled to room temperature. In a preferred embodiment, the final conversion heat treatment involves heating at a temperature in the range of 800° C. to 845° C. and at an oxygen pressure in the range of 0.003 to 0.21 atm $O_2$. The step of heating to form the final oxide superconductor preferably includes cooperatively selecting the relevant processing temperature and oxygen partial pressure, such that oxygen partial pressure is below a value at which the final superconducting material decomposes or melts and above a value at which the dominant orthorhombic phase decomposes. It may alternatively preferably include heating at a temperature in the range of 800° C. to 845° C. and at an oxygen pressure in the range of 0.003 to 0.21 atm $O_2$. It may alternatively preferably include heating in a first step in the range of about 810–850° C.; heating in a second step in the range of about 780–840° C.; and heating in a third step in the range of about 600–800° C., said first, second and third heating steps at an oxygen pressure in the range of 0.003 to 0.21 atm $O_2$. It may alternatively preferably include heating at a first temperature in the range of 650° C. to 795° C. and at a first oxygen pressure in the range of 0.0001 to 0.075 atm $O_2$; and heating at a second temperature in the range of 800° C. to 845° C. and at a second oxygen pressure in the range of 0.003 to 0.21 atm $O_2$. It may also alternatively include heating at a first temperature in the range of 650° C. to 795° C. and at a first oxygen pressure in the range of 0.0001 to 0.075 atm $O_2$; and heating in a second step in the range of about 810–850° C.; heating in a third step in the range of about 780–840° C.; and heating in a fourth step in the range of about 600–800° C., said second, third and fourth heating steps at an oxygen pressure in the range of 0.003 to 0.21 atm $O_2$.

In some preferred embodiments, the temperature s and oxygen partial pressures for the final conversion step are selected to avoid conditions at which the dominant orthorhombic phase decomposes. In other preferred embodiments, the final conversion step includes ramping through a temperature range and an oxygen partial pressure range, such that the temperature and oxygen partial pressure range cooperatively include a value at which the dominant orthorhombic BSCCO phase, preferably (Bi,Pb)SCCO 2212, decomposes. The ramping is at a rate sufficiently rapid such that the decomposition of the dominant orthorhombic BSCCO phase is kinetically disfavored. In a preferred embodiment, the ramp rate is greater than 0.1° C./min and most preferably is in the range of 0.1 to 100° C./min.

In another aspect of the present invention, a multifilamentary composite precursor for an elongated BSCCO superconducting article is manufactured by first heating a mixture of raw materials of a desired ratio of constituent metallic elements corresponding to a final superconducting BSCCO material at a first selected processing temperature in an inert atmosphere with a first selected oxygen partial pressure for a first selected time period. The first processing temperature and partial pressure are cooperatively selected to form a dominant amount of certain selected intermediate phases having a dominant amount of a tetragonal BSCCO phase in the reacted mixture. A billet is then formed which is comprised of filaments containing the reacted mixture substantially surrounded by a constraining metal, and a bundle is then formed including a plurality of billets. Next, the bundle is thermomechanically consolidated by applying heat and pressure under conditions cooperatively selected to cause interdiffusion of the constraining metal at the interfaces between said metal and said filaments and substantially complete elimination of voids in the article, and consolidation is completed before any high strain longitudinal deformation is performed on the bundle. The article is then heated at a second selected processing temperature in an inert atmosphere with a second selected oxygen partial pressure for a second selected time period cooperatively selected to form a dominant amount of an orthorhombic BSCCO phase in the reacted mixture.

The precursor is characterized in that each of its plurality of filaments contains a dominant amount of a tetragonal BSCCO 2212 phase, in that its filaments are substantially unbuckled, and in that the average void fraction of closed pore space in the precursor is less than 5%, more preferably less than 3%, and most preferably less than 1%.

A texture-inducing deformation may be performed on the precursor article to form an elongated precursor article of a desired texture. In a preferred embodiment, the elongated precursor article is then heated at a third selected processing temperature in an inert atmosphere with a third selected oxygen partial pressure for a third selected time period. The third processing temperature and the third oxygen partial pressure are cooperatively selected to convert at least a portion of the orthorhombic BSCCO phase to the final superconducting BSCCO material. In preferred embodiments, the final oxide superconductor comprises (Bi,Pb)SCCO 2223, the tetragonal BSCCO phase comprises tetragonal (Bi,Pb)SCCO 2212 and the orthorhombic BSCCO phase comprises orthorhombic (Bi,Pb)SCCO 2212. In other preferred embodiments, the final oxide superconductor comprises BSCCO 2223, the tetragonal BSCCO phase comprises tetragonal BSCCO 2212 and the orthorhombic BSCCO phase comprises orthorhombic BSCCO 2212.

Figure 5:
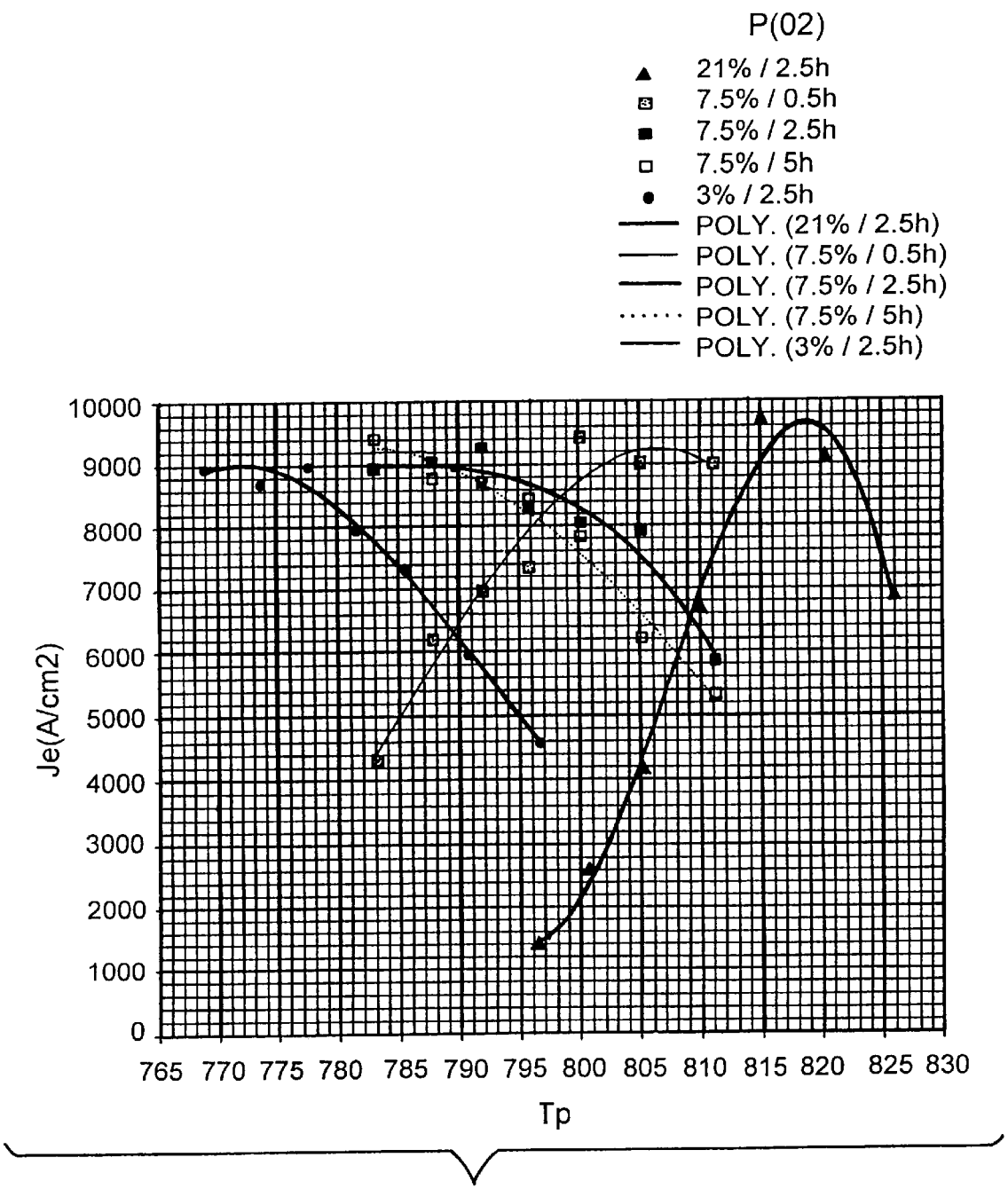
FIG. 5 depicts the relationship between the engineering critical current density, $J_e$, of multifilament (Bi,Pb)SCCO 2223 tapes fabricated in accordance with the invention, as further described in Example 1, and the conditions selected for the tetragonal to orthorhombic phase conversion.

A study was performed to determine the effect on the engineering critical current density, $J_e$, of a final BSCCO 2223 superconductor article of the processing conditions used to form a precursor powder which includes a dominant amount of an orthorhombic BSCCO 2212 phase. Multifilamentary tapes were fabricated by the OPIT method as described in Example 1. The $J_c$'s of the final products were measured (in amp/cm$^2$, using the 1 $\mu$V/cm, 77° K self-field standard measurement criterion). From the $J_c$'s, the $J_e$'s of the products were calculated and compared. The $J_e$, or engineering critical current density, is the $J_c$ multiplied by the average fill factor of the composite, i.e. the total filament area in a perpendicular cross-section divided by the total area of the cross-section. A plot of engineering critical current density, $J_e$, v. processing temperature, Tp, for selected processing times, tp, and oxygen partial pressures, P(O2) is depicted in FIG. 5. The data in FIG. 5 shows that a wide range of processing conditions can be used to perform the tetragonal to orthorhombic phase conversion.

The following examples further disclose the invention and enable practice thereof:

EXAMPLE 1

In the precursor powder formation stage, a homogenous powder including Bi, Pb, Sr, Ca, and Cu in metal ratios of 1.7:0.3:1.9:2.0:3.0 was prepared by pyrolysis of a nitrate solution at 750–820° C. in air for 1–20 hours to produce the desired phase constitution of Bi-2212 plus a mixture of additional oxide phases.

The prepared precursor powder was packed into a 5.5" (14.0 cm) long Ag tube with an outer diameter of 0.615" (1.56 cm) and inner diameter of 0.42" (1.07 cm). The tube was sealed at both ends, treated for removal of moisture and $CO_2$ that may have absorbed into the powder, and then drawn into a long narrow round wire. This wire was then shaped into wire having a hexagonal cross section and this hexagonal wire was then cut into 19 segments (filaments) each 20 inches (50.8 cm) in length. Theses filaments were then bundled into a hexagonal array and encased by another Ag tube with an outer diameter of 0.42" (1.07 cm) and inner diameter of 0.38" (0.97 cm). This assembly (multi-filament bundle) was then heated to 450° C. for 4 hours in air and subsequently sealed.

The multi-filament bundle was then consolidated by drawing the bundle through two die passes followed by a thermal treatment at 600° C. for 2 hours in air. Drawing was then continued to form a long length of multi-filament round wire with a diameter of 0.023" (0.06 cm).

The multi-filament precursor was then subjected to a thermal treatment to obtain tetragonal-orthorhombic phase transformation over a wide range of processing conditions including P(O2)'s between 0.03 atm and 0.21 atm, temperatures, Tp, within a range of 765° C. to 830° C., with treatment times, tp, of either 0.5, 2.5, or 5 hours. Following this thermal treatment, the round wires were rolled into tape in accordance with U.S. '089 and subjected to a "2DS" thermomechanical process. In accordance with the "2DS" process, it was heated at 827° C. for 20 hours in an atmosphere containing 0.075 atm O2, and rolled again at a 10% reduction. It then underwent a final heat treat sequence of 827° C. for 20 hours in an atmosphere containing 0.075 atm O2, 808° C. for 40 hours in an atmosphere containing 0.075 atm O2, 724° C. for 30 hours in an atmosphere containing 0.075 atm O2 and cooling to ambient temperature.

The $J_c$'s of the final products were measured (using the 1 $\mu$V/cm, 77 K self-field standard measurement criterion). From the $J_c$'s, the $J_e$'s of the products were calculated and compared. The $J_e$, or engineering critical current density, is the $J_c$ multiplied by the average fill factor of the composite, i.e. the total filament area in a perpendicular cross-section divided by the total area of the cross-section. The data in FIG. 5 shows that a wide range of processing conditions can be used to perform the tetragonal to orthorhombic phase conversion, however it also shows that by fixing any two of the three treatment parameters (Tp, tp, P(O2)) optimization of the third is required. In the table below, selected data from the figure are extracted. Each set of extracted data shows two fixed parameters and one varied parameter; the number in boldface represents the value of the varied parameter (of those tested) which yielded the highest Je for the selected fixed conditions.

|  | P(O2) | Tp | tp |
| --- | --- | --- | --- |
| Example A | FIXED | VARIED | FIXED |
|  | (0.21 atm) | (819° C.) | (2.5 hour) |
| Example B | FIXED | FIXED | VARIED |
|  | (0.075 atm) | (805° C.) | (0.5 hour) |
| Example C | VARIED | FIXED | FIXED |
|  | (0.075 atm) | (796° C.) | (2.5 hour) |

EXAMPLE 2

In the precursor powder formation stage, a homogenous mixture of Bi, Pb, Sr, Ca and Cu nitrides with metal ratios of 1.7:0.3:1.9:2.0:3.0 was decomposed to the metal oxides by reaction at 790° C. for 10 minutes in air. The metal oxide mixture was then milled to reduce the particle size and homogenize the mixture. The milled oxide powder was then reacted in 100% $O_2$ for 10 hours at 790° C. The reacted oxide mixture was again milled to reduce the particle size. Next, the milled powder was reacted at 750–820° C. in air for 1–20 hours to obtain the tetragonal (Bi,Pb)SCCO 2212 phase, and several non-superconducting phases.

The precursor powder was then used in the OPIT precursor fabrication phase to form a multifilamentary composite precursor for a superconducting wire. The powder was packed into four silver billets, each with an outer diameter of 1.25" (3.18 cm), and a length of 10.0" (25.4 cm). Each billet was deformed into a 70 mil (0.178 cm) silver-(Bi, Pb)SCCO monofilamentary hexagonal wire by multiple drawing steps. Two identical multi-filamentary composite precursors (A,B) were fabricated by rebundling 85 of the hexagonal wires in a pure silver tube with an outer diameter of 0.84" (2.13 cm) and an inner diameter of 0.76" (1.93 cm). Two identical multi-filamentary composite precursors (C,D) were fabricated by rebundling 85 of the hexagonal wires in an ODS silver tube with an outer diameter of 0.84" (2.13 cm) and an inner diameter of 0.76" (1.93 cm). Each precursor was subjected to a different iterative processes of alternating heating/annealing and mechanical deformation, as described below.

Precursors A and B were annealed in air at 450° C. for 2 hours. They were then consolidated by drawing at a 15% reduction per pass through two drawing passes, and annealing in air at 600° C. for 2 hours. They were then given a second consolidation step by drawing at a 15% reduction per pass through two additional drawing passes and by annealing in air at 600° C. for 2 hours. The anneal temperatures were high enough to cause silver grain growth and interfacial bonding at all matrix/filament interfaces.

Precursor A was drawn to a 35 mil (0.089 cm) diameter. The desired orthorhombic Bi-2212 precursor phase to Bi-2223 was then formed by baking the samples at 780° C. for 2 hours in 0.075 atm oxygen-balance argon (to 1 atm total) followed by rolling deformation into a 6 mil (0.015 cm) tape. The composite tape was given a 2DS heat treatment. It was heated at 827° C. for 20 hours in an atmosphere containing 0.075 atm 02, and rolled again at a 10% reduction. It then underwent a final heat treat sequence of 827° C. for 20 hours in an atmosphere containing 0.075 atm 02, 808° C. for 40 hours in an atmosphere containing 0.075 atm 02, 724° C. for 30 hours in an atmosphere containing 0.075 atm 02 and cooling to ambient temperature.

Precursor B was also drawn to a 35 mil (0.089 cm) diameter, and then roll deformed into a 6 mil (0.015 cm) tape, still containing the tetragonal precursor powder. Like Precursor A, it was given a 2DS heat treatment. It was heated at 827° C. for 20 hours in an atmosphere containing 0.075 atm 02, and rolled again at a 7% reduction. It then underwent a final heat treat sequence of 827° C. for 20 hours in an atmosphere containing 0.075 atm 02, 808° C. for 40 hours in an atmosphere containing 0.075 atm 02, 724° C. for 30 hours in an atmosphere containing 0.075 atm 02 and cooling to ambient temperature.

Precursors C and D were annealed in air at 300° C. for 2 hours, drawn at a 15% reduction per pass through two drawing passes, and immediately annealed in air at 300° C. for 2 hours. They were then drawn at a 15% reduction per pass through two additional drawing passes and annealed in air at 300° C. for 2 hours. Both were drawn to a 36 mil (0.091 cm) diameter. The desired orthorhombic Bi-2212 precursor phase was then formed by baking the samples at 787° C. for 2 hours in 0.075 atm oxygen-balance argon (to 1 atm total) followed by rolling deformation into a 6.5 mil (0.016 cm) tape. Like Precursor A, each was given a 2DS treatment, as follows. Each was heated at 827° C. for 20 hours in an atmosphere containing 0.075 atm 02, rolled again to a 7% reduction and given a final heat treat sequence of 827° C. for 20 hours in an atmosphere containing 0.075 atm 02, 808° C. for 40 hours in an atmosphere containing 0.075 atm 02, 724° C. for 30 hours in an atmosphere containing 0.075 atm 02 and cooling to ambient temperature.

The $J_c$'s of the four final products were measured (using the 1 $\mu$V/cm, 77 K self-field standard measurement criterion) and compared. A, which underwent a tetragonal-orthorhombic phase transformation at high $pO_2$, and which was consolidated prior to the transformation, had a $J_c$ of 52,000 A/cm$^2$. B, which was consolidated, but did not undergo a tetragonal-orthorhombic phase transformation, had a $J_c$ of 30,000 A/cm$^2$. C and D, which underwent a tetragonal-orthorhombic phase transformation at high p(O2), but which were not consolidated prior to the transformation, had $J_c$'s of 20,000 A/cm$^2$ and 24,000 A/cm$^2$, respectively.

EXAMPLE 3

A powder was manufactured as in Example 2 to obtain the tetragonal (Bi,Pb)SCCO 2212 phase, and several non-superconducting phases.

The powders were packed into a Ag tube 1.24" (3.14 cm) in outer diameter, 1.12" (2.84 cm) in inner diameter, and 10" (25.4 cm) long, and following by drawing processes into hex monofilament. The monofilamentary wire was cut into 40" (101.6 cm) length and ready for multifilament assemblage. An 85 filament composite precursor was made by rebundling the monofilaments into a double tubes, the outer one silver of dimensions 1.31" (3.33 cm)×1.25" (3.18 cm), the inner one ODS silver of dimensions 1.24" (3.15 cm)×1.12" (2.84 cm). The ends of the tubes were capped, and the tubes were evacuated at 25° C. to 550° C. for 1 to 50 hours and then sealed.

The precursors were thermomechanically consolidated by hot isostatic pressing (HIP) at 450° C. for 4 hours at 54–102 atm gauge in an inert gas, in this case argon, causing a reduction in outer diameter of 0.05" (0.13 cm). The precursor was then drawn to a 0.040" (0.1 cm)×0.080" (0.2 cm) rectangular precursor. After deformation, a heat treatment was performed by heating at 797° C. for 0.5 hours in an atmosphere of 7.5% oxygen to obtain the desired orthorhombic 2212 phase. Following this treatment, the wire was rolled to a 0.008" (0.02 cm) tape followed by a 2DS heat treatment like the one described in Example 2, which ultimately produced a 0.008" (0.02 cm)×0.161" (0.04 cm) tape. The $J_c$ of the tape was measured using the 1 $\mu$V/cm, 77 K self-field standard measurement criterion)and, from the $J_c$, the $J_e$ of the tape was calculated. The tape had a $J_e$ performance of 10,700 amps per cm$^2$.

EXAMPLE 4

A raw powder may be made using nitrates, reacted to obtain the tetragonal (Bi,Pb)SCCO 2212 phase and several non-superconducting phases, and made into an 85 filament composite precursor, all as in Example 3. The precursors may be thermomechanically consolidated by cold isostatic pressing (CIP) at 25° C. for 1–100 hours at 1000 atm in liquid pressurization media, air, or another gas, followed by a 600° C. thermal anneal (2 hrs in air) for grain growth. The precursor may be further processed into a superconducting article as described in Examples 1–3.

EXAMPLE 5

A precursor powder prepared as in Example 1 was used to prepare a 19 filament multifilamentary composite precursor containing the tetragonal (Bi,Pb)SCCO 2212 phase, and several non-superconducting phases in a stoichiometry corresponding to the desired final (Bi,Pb)SCCO 2223 superconducting material.

The precursor was annealed in air at 450° C. for 2 hours, drawn at a 15% reduction per pass through two drawing passes, and immediately consolidated by annealing in air at 600° C. for 2 hours. It was then drawn at a 15% reduction per pass through two additional drawing passes and a second consolidation step was performed by annealing in air at 600° C. for 2 hours. A visual examination of the precursor was performed at this point and no blisters were observed. The precursor was drawn to a 23 mil (0.058 cm) diameter, and divided into 5 parts. The desired orthorhombic Bi-2212 precursor phase to Bi-2223 was then formed in 3 of the parts by baking the first in 0.075 atm oxygen-balance nitrogen (to 1 atm total) at 780° C. for 1 hour, the second in 0.075 atm oxygen-balance nitrogen (to 1 atm total) at 790° C. for 1.5 hour, and the third in 0.075 atm oxygen-balance nitrogen (to 1 atm total) at 800° C. for under 0.5 hour. The desired orthorhombic Bi-2212 precursor phase to Bi-2223 was then formed in the last two parts by baking one in air (0.21 atm oxygen at 1 atm total) at 815° C. for at least 2 hours, and the other in air at 800° C. for at least 2.5 hours. The phase transformation was followed by a rolling deformation of each part into a 4 mil (0.01 cm) tape.

Each composite tape was heated at 827° C. for 20 hours in an atmosphere containing 0.075 atm O2, and rolled again to 3.5 mil (0.009 cm). It then underwent a final heat treat sequence of 827 C. for 20 hours in an atmosphere containing 0.075 atm O2, 808 C. for 40 hours in an atmosphere containing 0.075 atm O2, 724 C. for 30 hours in an atmosphere containing 0.075 atm O2 and cooling to ambient temperature.

Figure 6:
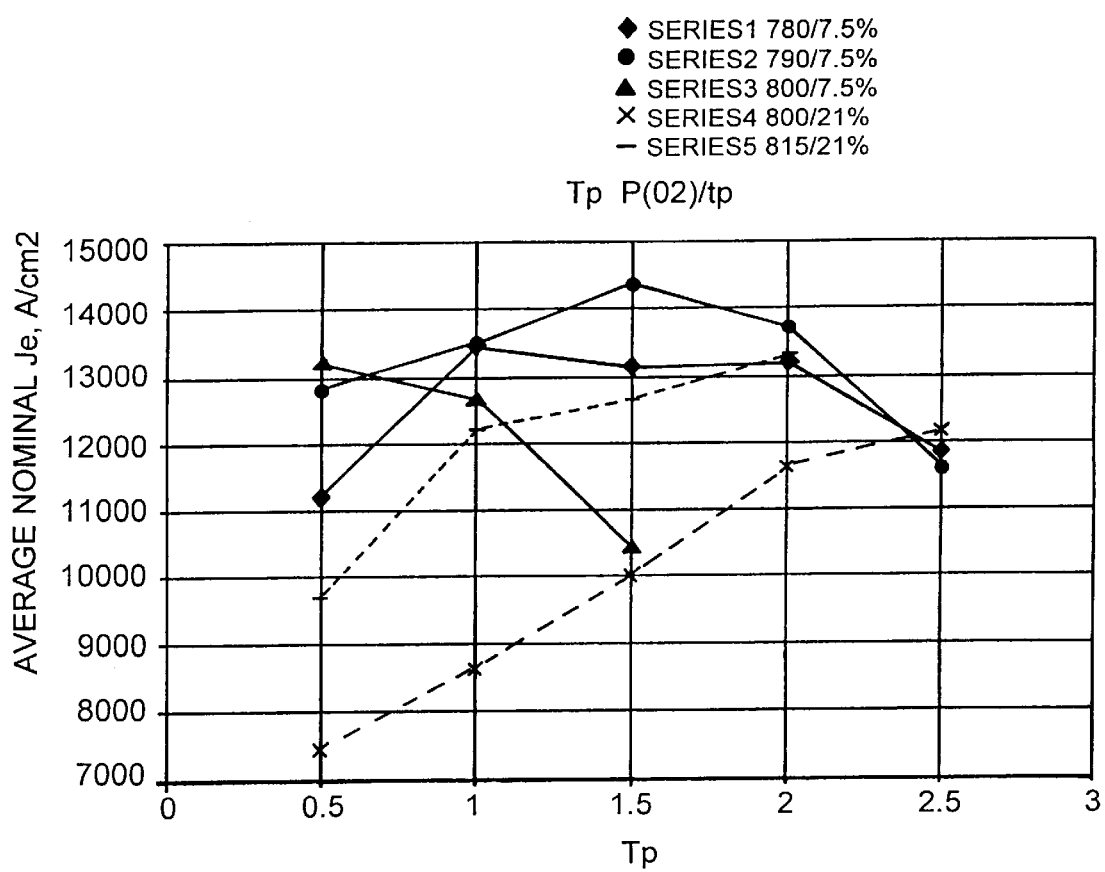
FIG. 6 depicts the relationship between the engineering critical current density, $J_e$, of multifilament (Bi,Pb)SCCO 2223 tapes fabricated in accordance with the invention, as further described in Example 5, and the conditions selected for the tetragonal to orthorhombic phase conversion.

The $J_c$'s and $J_e$'s of the five final products were determined (using the 1 $\mu$V/cm, 77 K self-field standard measurement criterion) and the average nominal $J_e$ is shown for each part in FIG. 6. The $J_e$, or engineering critical current density, is the $J_c$ multiplied by the fill factor of the composite, in this case, 0.24. FIG. 6 demonstrates that, by use of the invention including an appropriate choice of tetragonal to orthorhombic conversion conditions, very high electrical performances may be obtained.

EXAMPLE 6

A powder was manufactured as in Example 2 to obtain the tetragonal (Bi,Pb)SCCO 2212 phase, and several non-superconducting phases.

The powders were packed into a Ag tube 1.24" (3.14 cm) in outer diameter, 1.12" (2.84 cm) in inner diameter, and 10" (25.4 cm) long, and following by drawing processes into hex monofilament. The monofilamentary wire was cut into 40" (101.6 cm) length and ready for multifilament assemblage. Two 85 filament composite precursors were made by rebundling the monofilaments into a double tubes, the outer one silver of dimensions 1.31" (3.33 cm)×1.25" (3.18 cm), the inner one ODS silver of dimensions 1.24" (3.15 cm)×1.12" (2.84 cm). The ends of the tubes were capped, and the tubes were evacuated at 25° C. to 550° C. for 1 to 50 hours and then sealed.

Figure 8:
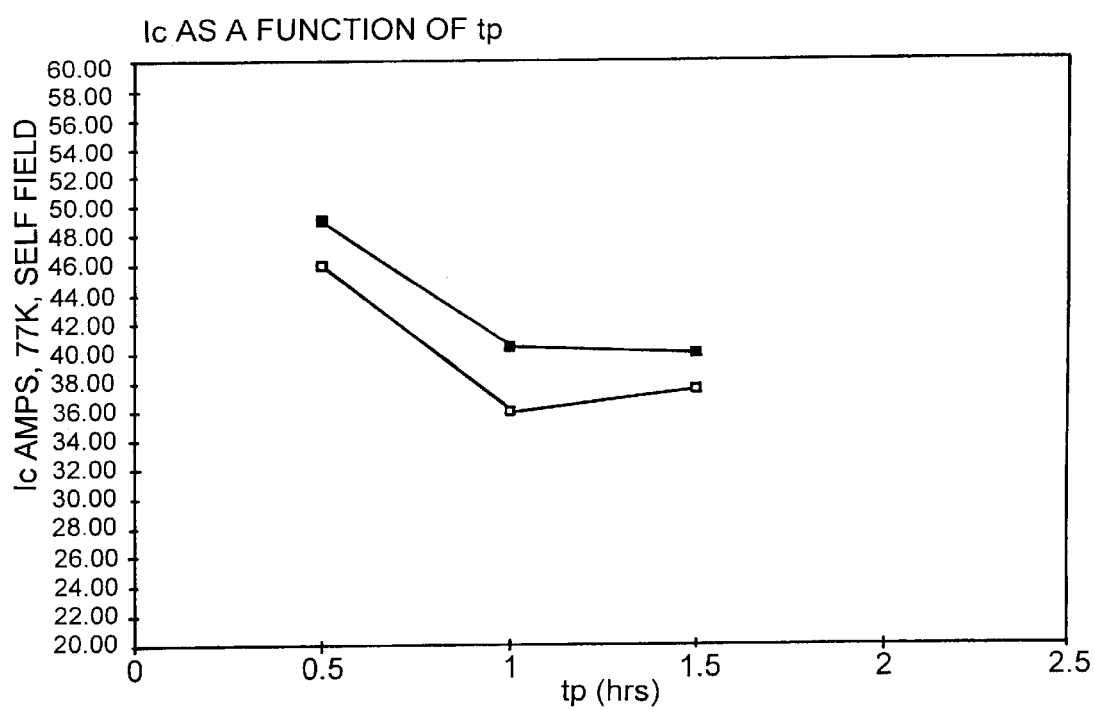
FIG. 8 depicts the relationship between the critical current, $I_c$, of multifilament (Bi,Pb)SCCO 2223 tapes fabricated in accordance with the invention, as further described in Example 6, and the conditions selected for the tetragonal to orthorhombic phase conversion.

The precursors were thermomechanically consolidated by hot isostatic pressing (HIP) at 450° C. for 4 hours at 54–102 atm absolute in an inert gas, in this case argon, causing a reduction in outer diameter of 0.05" (0.13 cm). Each precursor was then drawn to a 0.040" (0.1 cm) diameter round precursor. After deformation, a heat treatment was performed by heating at 787° C. for 0.5, 1.0 and 1.5 hours in an atmosphere of 7.5% oxygen to obtain the desired orthorhombic 2212 phase. Following this treatment, the wire was rolled to a 0.0075" (0.019 cm) tape followed by a 2DS heat treatment like the one described in Example 2, which ultimately produced 0.007" (0.018 cm)×0.103" (0.026 cm) tape. The critical current, $I_c$, of the two tapes are shown as a function of tp in FIG. 8. The $J_c$ and $J_e$'s of the two final products were determined (using the 1 $\mu$V/cm, 77 K self-field standard measurement criterion). The tapes had peak $J_e$ performances of 10,500 and 9,900 amps per cm$^2$, respectively.

Other embodiments of the invention will be apparent to those skilled in the art from a consideration of this specification or practice of the invention disclosed herein. It is intended that the specification, examples and the accompanying drawings shall be interpreted as illustrative and not in a limiting sense, with the true scope and spirit of the invention being indicated by the following claims.

What is claimed is:

1. A method of manufacture of an elongated bismuth-strontium-calcium-copper-oxide (BSCCO) superconducting article, comprising the steps of:

forming a bundle including a plurality of billets, each billet comprising a constraining metal substantially surrounding at least one filament comprising a dominant amount of a tetragonal BSCCO phase with selected intermediate phases;

thermomechanically consolidating said bundle to form a multifilamentary precursor article by applying pressure and heat to the bundle to cause interdiffusion of said constraining metal at the interfaces between said metal and said filaments and substantially complete elimination of voids in said bundle;

completing said consolidation step before any high strain longitudinal deformation is performed on the bundle;

heating said article at a second selected processing temperature in an inert atmosphere with a second selected oxygen partial pressure for a second selected time period, thereby forming a dominant amount of an orthorhombic BSCCO phase in the reacted mixture;

performing texture-inducing deformation on said article to form an elongated precursor article of a desired texture; and heating said elongated precursor article at a third selected processing temperature in an inert atmosphere with a third selected oxygen partial pressure for a third selected time period, thereby converting at least a portion of said orthorhombic BSCCO phase to said final superconducting BSCCO material.

2. A method according to claim 1 wherein said bundle is consolidated by simultaneously applying pressure and heat under conditions sufficient to substantially eliminate voids in the article without buckling the filaments, and to promote grain growth of the constraining metal.

3. A method according to claim 2 wherein said bundle is consolidated by hot isostatic pressing.

4. A method according to claim 3 wherein said constraining metal is selected from the group consisting of silver and high silver content alloys, and said bundle is hot isostatically pressed at a pressure in the range of about 3 atm. to about 999 atm., and a temperature in the range of about 200° C. to about 750° C. for a time in the range of about 1 hour to about 36 hours.

5. A method according to claim 4 wherein said bundle is hot isostatically pressed at a pressure in the range of about 3 atm. to about 420 atm., and a temperature in the range of about 200° C. to about 600° C.

6. A method according to claim 5 wherein said bundle is hot isostatically pressed at a pressure in the range of about 3 atm. to about 140 atm., and a temperature in the range of about 300° C. to about 600° C.

7. A method according to claim 1 wherein said bundle is consolidated by applying pressure followed by heat under conditions sufficient to substantially eliminate voids in the article without buckling the filaments and to promote grain growth of the constraining metal at the interfaces between the constraining metal and the filaments.

8. A method according to claim 7 wherein the heating step is a thermal anneal.

9. A method according to claim 8 wherein said constraining metal is selected from the group consisting of silver and high silver content alloys, and the thermal anneal is performed at a pressure of about 1 atm and a temperature in the range of about 400° C. to about 750° C. for a time in the range of about 5 minutes to about 50 hours.

10. A method according to claim 9 wherein the pressure step is cold isostatic pressing under conditions sufficient to substantially eliminate voids in the article without buckling the filaments.

11. A method according to claim 10 wherein said constraining metal is selected from the group consisting of silver and high silver content alloys, and said bundle is cold isostatically pressed at a pressure in the range of about 10 atm. to about 2000 atm., at about ambient temperature for a time in the range of about 1 hour to about 100 hours.

12. A method according to claim 11 wherein said article is cold isostatically pressed at a pressure in the range of about 100 atm. to about 1100 atm.

13. A method according to claim 9 wherein the pressure step is drawing under conditions sufficient to substantially eliminate voids in the article without buckling the filaments.

14. A method according to claim 13 wherein the pressure step is drawing to a reduction such that the total area reduction of the bundle after it is formed but before the thermal anneal is substantially equal to the average void fraction of closed pore space in the bundle.

15. A method according to claim 13 wherein the pressure step is drawing to a reduction such that the total area reduction of the bundle after it is formed but before the thermal anneal in the consolidation step is no more than about 67%.

16. A method according to claim 15 wherein the pressure step is drawing to an area reduction of from about 5% to about 50%.

17. The method of claim 1 wherein said bundling step and said consolidation step are repeated.

18. The method of claim 1 wherein said bundling step is repeated and said consolidation step is performed after the last bundling step.

19. The method of claim 1 wherein a step selected from the group consisting of sealing steps, cleaning steps, evacuation steps and low strain longitudinal deformation steps are performed after said bundling step and before said consolidation step.

20. The method of claim 1 wherein the step of forming a dominant amount of an orthorhombic BSCCO phase is carried out at a temperature in the range of 650° C. to 870° C. and an oxygen partial pressure in the range of 1.0 atm $O_2$ to 0.0001 atm $O_2$.

21. The method of claim 20 wherein the step of forming a dominant amount of an orthorhombic BSCCO phase is carried out at temperature in a range of 700° C. to 860° C. and an oxygen partial pressure in a range of 0.5 atm $O_2$ to 0.04 atm $O_2$.

22. The method of claim 21 wherein the step of forming a dominant amount of an orthorhombic BSCCO phase is carried out at a range of 740° C. to 850° C. and the oxygen partial pressure in a range of 0.21 atm $O_2$ to 0.04 atm $O_2$.

23. The method of claim 1, wherein said heating to form the dominant orthorhombic BSCCO phase comprises:
    selecting said second processing temperature, said second processing time and said second oxygen partial pressure, such that their values are below the stability line defined by the minimum values at which the dominant BSCCO phase melts or decomposes and above the stability line defined by the maximum values at which $Cu^{2+}$ decomposes to $Cu^+$.

24. The method of claim 23, wherein said dominant orthorhombic BSCCO phase comprises (Bi, Pb) SCCO 2212, said selected intermediate phases comprise $Pb^{+4}$ phases, and said heating to form the dominant orthorhombic BSCCO phase further comprises:
    selecting said second processing temperature, said second processing time and said second oxygen partial pressure, such that their values also fall within the region where substantial portions of the $Pb^{+4}$ phases are reduced to $Pb^{+2}$ phases.

25. The method of claim 1 wherein said heating to form the final oxide superconductor comprises:
    heating at a temperature in the range of 800° C. to 845° C. and at an oxygen pressure in the range of 0.003 to 0.21 atm $O_2$.

26. The method of claim 1 wherein said heating to form the final oxide superconductor comprises:
    heating in a first step in the range of about 810–850° C.;
    heating in a second step in the range of about 800–840° C.; and
    heating in a third step in the range of about 700–800° C., said first, second and third heating steps at an oxygen pressure in the range of 0.003 to 0.21 atm $O_2$.

27. The method of claim 1 further comprising:
    the steps of sequentially repeating said texture-inducing deforming step and said final oxide superconductor-forming heating steps.

28. The method of claim 1, wherein the step of forming a bundle comprises the steps of:
    heating a mixture of raw materials of a desired ratio of constituent metallic elements corresponding to the final superconducting BSCCO material at a first selected processing temperature in an inert atmosphere with a first selected oxygen partial pressure for a first selected time period, thereby forming a dominant amount of certain selected intermediate phases having a dominant amount of a tetragonal BSCCO phase in the reacted mixture; and, forming a billet including at least one filament containing said reacted mixture and substantially surrounded by a constraining metal.

29. The method of claim 1 wherein said final oxide superconductor comprises (Bi,Pb)SCCO 2223, said tetragonal BSCCO phase comprises tetragonal (Bi,Pb)SCCO 2212 and said orthorhombic BSCCO phase comprises orthorhombic (Bi,Pb)SCCO 2212.

30. The method of claim 29, wherein said heating to form the final oxide superconductor comprises:

ramping through a temperature range and an oxygen partial pressure range, said temperature and oxygen partial pressure range cooperatively including a value at which said dominant orthorhombic (Bi,Pb)SCCO phase decomposes, said ramping at a rate sufficiently rapid such that the formation of the Ca-Pb-O phase and decomposition of the dominant orthorhombic (Bi,Pb)SCCO phase is kinetically disfavored.

31. The method of claim 1 wherein said final oxide superconductor comprises BSCCO 2223, said tetragonal BSCCO phase comprises tetragonal BSCCO 2212 and said orthorhombic BSCCO phase comprises orthorhombic BSCCO 2212.

* * * * *

UNITED STATES PATENT AND TRADEMARK OFFICE
CERTIFICATE OF CORRECTION

PATENT NO. : 6,069,116
DATED : May 30, 2000
INVENTOR(S) : Qi Li, Gilbert N. Riley, Jr., Lawrence J. Masur, Eric R. Podtburg, Ronald D. Parrella, Martin W. Rupich, Donald R. Parker, William L. Carter, William J. Rosati, Mark D. Teplitsky It is certified that error appears in the above-identified patent and that said Letters Patent is hereby corrected as shown below:

Title page,
Under U.S. PATENT DOCUMENTS, please insert the following:

-- 5,086,034    02/1992    Balachandran et al.
   5,147,848    09/1992    Chang et al.
   5,152,973    10/1992    Spencer et al.
   5,288,699    02/1994    Sato et al.
   5,057,486    10/1991    Arendt et al.
   5,204,316    04/1993    Arendt et al.
   5,100,869    03/1992    Masumoto et al. --

After listings all U.S. Patent Documents, please insert the following:

-- FOREGIN PATENT DOCUMENTS

JP 4214415      03/1992    Japan
DD 290292       05/1992    Germany
0 431 643 A1    06/1991    Europe
0 470 595 A1    02/1992    Europe
0 447 994 A2    09/1991    Europe
0 449 161 A3    10/1991    Europe
0 467 238 A1    01/1991    Europe
0 496 281 A2    07/1992    Europe
0 371 453 A2    06/1993    Europe
0 536 730 A1    04/1993    Europe
0 317 877 A1    05/1989    Europe

UNITED STATES PATENT AND TRADEMARK OFFICE
CERTIFICATE OF CORRECTION

PATENT NO. : 6,069,116
DATED : May 30, 2000
INVENTOR(S) : Qi Li, Gilbert N. Riley, Jr., Lawrence J. Masur, Eric R. Podtburg, Ronald D. Parrella, Martin W. Rupich, Donald R. Parker, William L. Carter, William J. Rosati, Mark D. Teplitsky It is certified that error appears in the above-identified patent and that said Letters Patent is hereby corrected as shown below:

| | | |
|---|---|---|
| EP 551,523 | 07/1993 | Europe |
| EP 475,315 | 03/1992 | Europe |
| WO 92/13649 | 08/1992 | WO |
| WO 96/39721 | 12/1996 | WO |

OTHER PUBLICATIONS

Balachandran et al., "Reduced-Pressure Calcination of Bismuth-Based Superconductors"
Presented at a Poster Session at the Materials Research Society Meeting, Boston MA (December 3, 1991)

Zhengping et al., "BiPbSrCaCuO Superconductor Prepared by a Three-Step Reaction Process" *Supercond. Sci. Technol.*, 5:240-246 (1992)

Idemoto et al., "Oxygen Nonstoichiometery of 2223 Phase Bi-Pb-Sr-Ca-Cu-O System Superconducting Oxide" *Physica C*, 181:171-178 (1991)

Sekine *et al.* " Comparison of Bi-system 2223 and 2212 Thick Superconducting Tapes: Grain Alignment, Current Density, and Strain Effects," *J. Appl. Phys.* 70:1596-1599 (1991) --

UNITED STATES PATENT AND TRADEMARK OFFICE
CERTIFICATE OF CORRECTION

PATENT NO. : 6,069,116
DATED : May 30, 2000
INVENTOR(S) : Qi Li, Gilbert N. Riley, Jr., Lawrence J. Masur, Eric R. Podtburg, Ronald D. Parrella, Martin W. Rupich, Donald R. Parker, William L. Carter, William J. Rosati, Mark D. Teplitsky It is certified that error appears in the above-identified patent and that said Letters Patent is hereby corrected as shown below:

Column 1
Line 21, repalce "bismuthstrontium-calcium-copper-oxide" with -- bismuth-strontium-calcium-copper-oxide --;

Column 17,
Line 15, replace "330" with -- 33 --;

Column 18,
Line 54, replace "temperature s" with -- temperatures --;

Column 20,
Line 54, replace the second "$J_c$" with -- $J_e$ --;

Signed and Sealed this

Thirteenth Day of November, 2001

NICHOLAS P. GODICI
Acting Director of the United States Patent and Trademark Office